US010522467B2

(12) United States Patent
Ishizaka et al.

(10) Patent No.: US 10,522,467 B2
(45) Date of Patent: Dec. 31, 2019

(54) RUTHENIUM WIRING AND MANUFACTURING METHOD THEREOF

(71) Applicant: TOKYO ELECTRON LIMITED, Tokyo (JP)

(72) Inventors: Tadahiro Ishizaka, Nirasaki (JP); Toshiaki Fujisato, Nirasaki (JP); Cheonsoo Han, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/637,780

(22) Filed: Jun. 29, 2017

(65) Prior Publication Data
US 2018/0012844 A1 Jan. 11, 2018

(30) Foreign Application Priority Data

Jul. 6, 2016 (JP) .................................. 2016-134043
Nov. 4, 2016 (JP) .................................. 2016-216142

(51) Int. Cl.
*H01L 23/48* (2006.01)
*H01L 23/52* (2006.01)
(Continued)

(52) U.S. Cl.
CPC .. *H01L 23/53209* (2013.01); *H01L 21/28556* (2013.01); *H01L 21/28562* (2013.01); *H01L 21/7684* (2013.01); *H01L 21/76802* (2013.01); *H01L 21/76843* (2013.01); *H01L 21/76856* (2013.01); *H01L 21/76877* (2013.01); *H01L 21/76879* (2013.01); *H01L 21/76883* (2013.01); *H01L 23/528* (2013.01); *H01L 23/53252* (2013.01)

(58) Field of Classification Search
CPC ............ H01L 21/768; H01L 21/76802; H01L 21/76838; H01L 21/7684; H01L 21/76841; H01L 21/76846; H01L 21/76867; H01L 21/76877; H01L 21/76879; H01L 23/53209; H01L 23/53242; H01L 23/53252
USPC .................. 257/750, 751, 752, 753, E21.584
See application file for complete search history.

(56) References Cited

U.S. PATENT DOCUMENTS

2003/0129309 A1* 7/2003 Otsuki ................ C23C 16/0218
427/255.28
2004/0080051 A1* 4/2004 Kawai ............... H01L 27/10817
257/758

(Continued)

FOREIGN PATENT DOCUMENTS

JP 2000-114474 A 4/2000
JP 2006-148075 A 6/2006
(Continued)

OTHER PUBLICATIONS

Wen, et al., "Ruthenium Metallization for Advanced Interconnects", Proceeding of IEEE IITC/AMC 2016, pp. 34-36.

*Primary Examiner* — Mohammed Shamsuzzaman
*Assistant Examiner* — Aaron J Gray
(74) *Attorney, Agent, or Firm* — Nath, Goldberg & Meyer; Jerald L. Meyer

(57) ABSTRACT

There is provided a ruthenium wiring, including: a TiON film formed as a base film in a recess formed in a predetermined film on a surface of a substrate; and a ruthenium film formed on the TiON film so as to fill the recess.

13 Claims, 21 Drawing Sheets

(51) Int. Cl.
*H01L 21/44* (2006.01)
*H01L 23/532* (2006.01)
*H01L 23/528* (2006.01)
*H01L 21/768* (2006.01)
*H01L 21/285* (2006.01)

(56) References Cited

U.S. PATENT DOCUMENTS

| | | | | |
|---|---|---|---|---|
| 2007/0222066 A1* | 9/2007 | Cabral, Jr. | .......... | H01L 21/2885 257/734 |
| 2012/0052323 A1* | 3/2012 | Chang | ................ | C23C 14/0036 428/651 |
| 2012/0074513 A1* | 3/2012 | Mitsui | ................... | H01L 27/301 257/431 |
| 2012/0091588 A1* | 4/2012 | Miyoshi | .............. | C23C 16/0272 257/751 |
| 2015/0255293 A1* | 9/2015 | Zhu | ................... | H01L 21/76819 438/587 |
| 2015/0318243 A1* | 11/2015 | Lin | .................. | H01L 21/28518 257/751 |
| 2017/0069711 A1* | 3/2017 | Lee | ........................ | H01L 28/75 |

FOREIGN PATENT DOCUMENTS

| | | | | | |
|---|---|---|---|---|---|
| JP | 2012184499 A | * | 9/2012 | .......... | C23C 16/308 |
| WO | 97/35341 A1 | | 9/1997 | | |

* cited by examiner

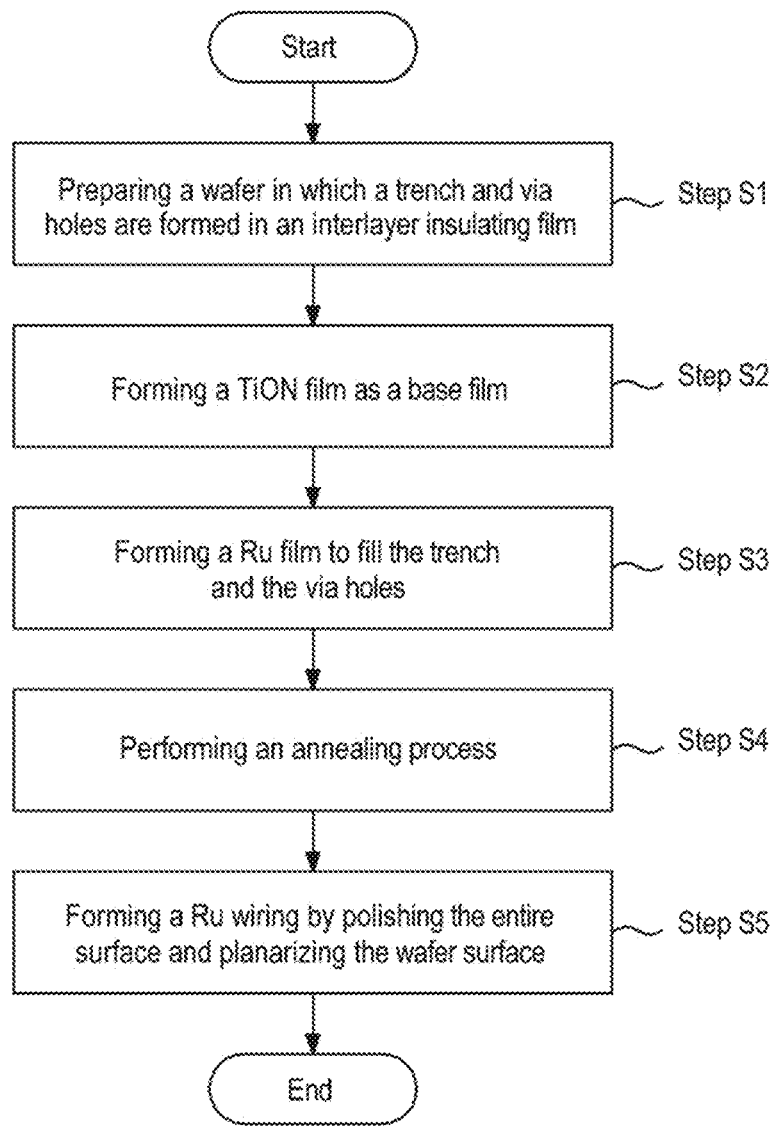

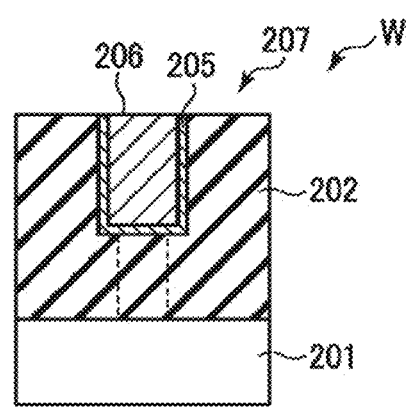

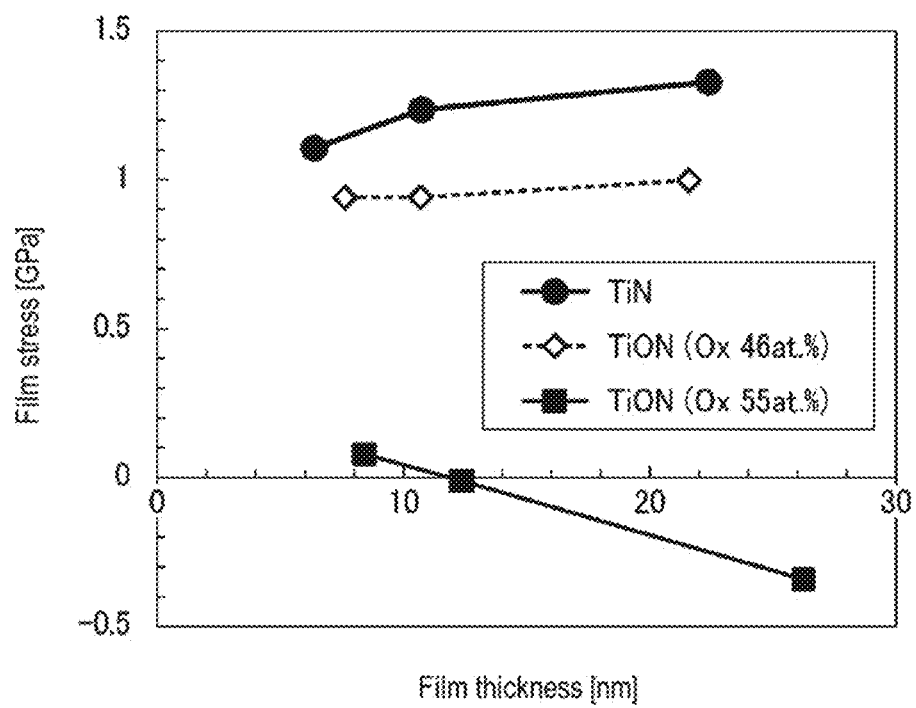

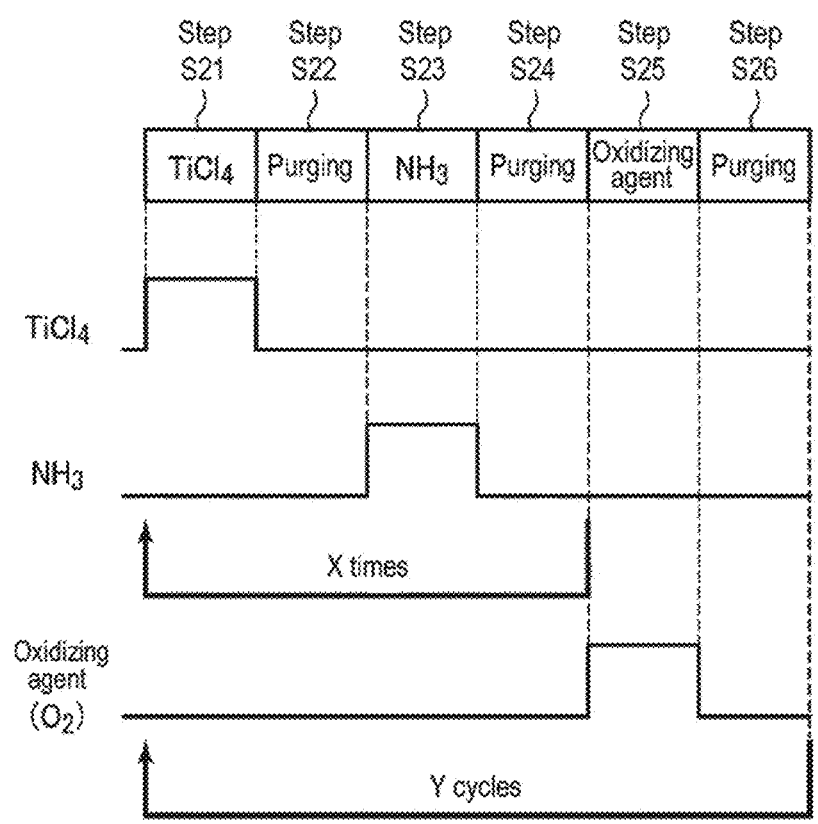

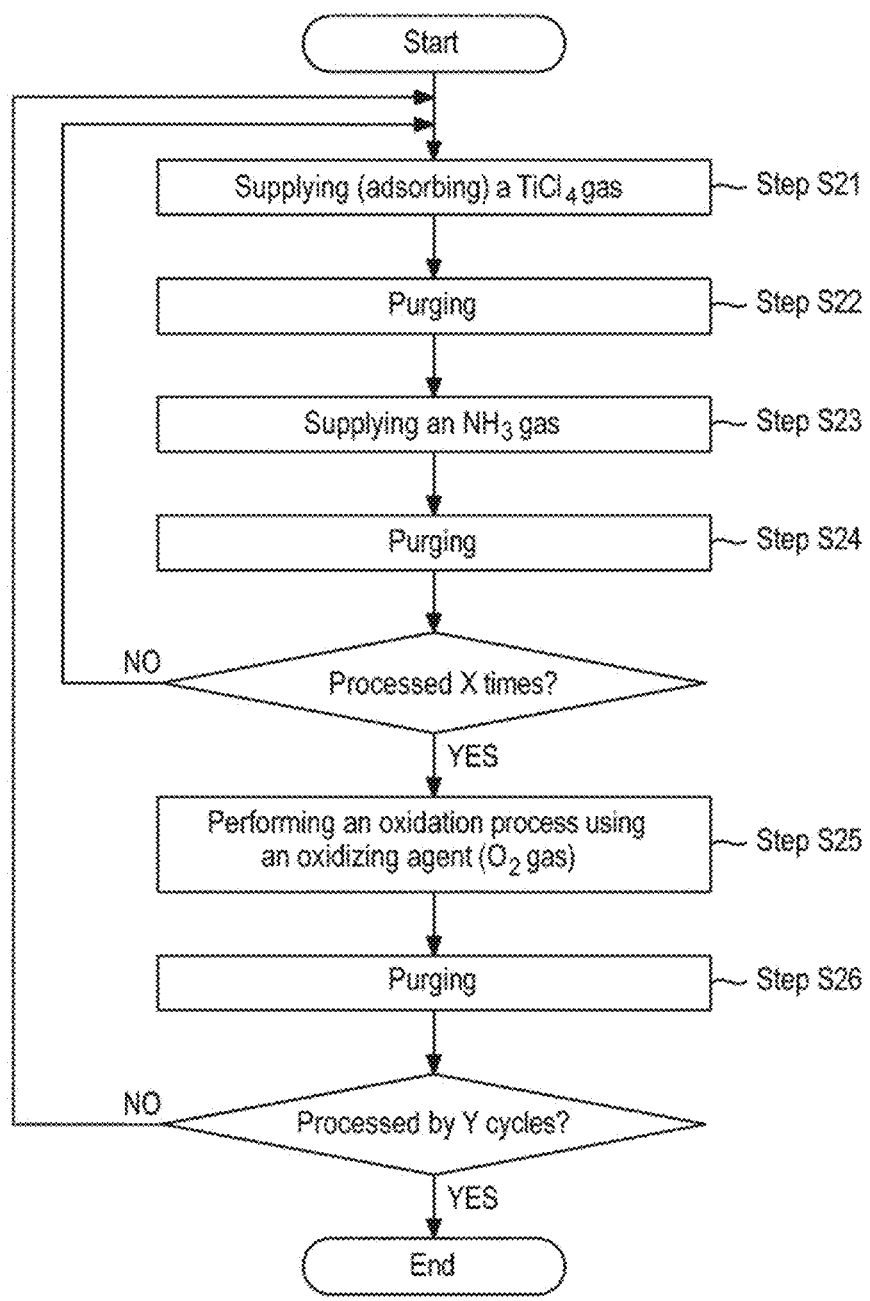

RUTHENIUM WIRING AND MANUFACTURING METHOD THEREOF

CROSS-REFERENCE TO RELATED APPLICATIONS

This application claims the benefit of Japanese Patent Application Nos. 2016-134043 and 2016-216142, filed on Jul. 6, 2016 and Nov. 4, 2016, in the Japan Patent Office, the disclosure of which is incorporated herein in their entirety by reference.

TECHNICAL FIELD

The present disclosure relates to a ruthenium wiring and a manufacturing method thereof.

BACKGROUND

Recently, miniaturization of wirings has progressed along with miniaturization of semiconductor devices. As a result, the problem that the RC delay caused by the increase in a wiring resistance and the increase in a coupling capacitance between wirings obstructs the high-speed operation of a device has become obvious. For this reason, in recent years, copper (Cu) having a lower bulk resistance than aluminum (Al) or tungsten (W), which is conventionally used, is used as a wiring material, and a low dielectric constant film (low-k film) is used as an interlayer insulating film.

However, as miniaturization further progresses, new problems are emerging in a Cu wiring. That is, according to the ITRS roadmap, the wiring width used in the 14 nm generation device is 32 nm, which is narrower than the mean free path of electrons in a Cu material, about 39 nm. Thus, an increase in a resistance value occurs due to scattering. Specifically, the resistance value of a wiring is expressed as the sum of a bulk resistance value, a resistance factor due to surface scattering and a resistance factor due to grain boundary scattering. Both the resistance factor due to surface scattering and the resistance factor due to grain boundary scattering are proportional to the mean free path of electrons. Therefore, when the mean free path of electrons becomes larger than the wiring width, the collision of electrons with a wiring side surface or a grain boundary becomes dominant, and the resistance value increases due to scattering. This becomes conspicuous as the wiring becomes finer.

Therefore, as a wiring material, ruthenium (Ru) in which a bulk resistance value is not as low as that of Cu and in which a mean free path of electrons within the material is shorter than that of Cu has been studied. Specifically, the bulk resistance value of Ru is 7.1 $\mu\Omega$-cm, which is higher than that of Cu, 1.7 $\mu\Omega$-cm. However, the mean free path of electrons of Ru is 10.8 nm, which is shorter than that of Cu, 38.7 nm.

In addition, the melting point of Ru is 2334 degrees C., which is higher than the melting point of Cu, 1085 degrees C. Therefore, Ru is more advantageous than Cu in terms of electro-migration resistance.

Unlike Cu, Ru hardly diffuses into an insulating film. Thus, a barrier property is not required in a base film of a Ru film. However, it is difficult to directly form a Ru film on an insulating film with good adhesion. For this reason, there has been proposed a technique in which a TiN film as a base film is formed on an insulating film and a Ru film is formed on the TiN film to form a Ru wiring.

On the other hand, as a technology for forming a Cu wiring, there is known a technology in which a barrier film is formed on an interlayer insulating film having a trench on the surface of a semiconductor wafer and a Cu film is embedded in the trench and then planarized by a CMP (Chemical Mechanical Polishing) method. Therefore, even when forming a Ru wiring, it is conceivable that after a Ru film is formed it is then planarized by a CMP process. Although not an example of a wiring, it is known that an accumulated anode electrode (SN) is formed by depositing a Ru film and then performing a planarization process by a CMP method or the like.

However, when a TiN film as a base film is formed on an insulating film and a Ru film is formed on the TiN film, since a tensile stress acts on both the TiN film and the Ru film, the stress becomes larger due to the laminated structure. For this reason, a wiring is subjected to a great stress. If the stress of the wiring is large, there is a concern that deformation of a wiring pattern such as collapse or undulation occurs. In particular, when a wiring structure becomes finer, an interval between wirings becomes shorter so that deformation of the wirings is more likely to occur.

In addition, Ru is a noble metal and has a low ionization tendency. Therefore, it is difficult to remove a Ru film on the surface of a semiconductor wafer by CMP. When CMP is used for planarization performed after embedding a Ru film in a trench, there could be a problem in that a lot of time is taken.

SUMMARY

Some embodiments of the present disclosure provide a ruthenium wiring and a manufacturing method thereof capable of controlling a stress generated in a wiring and suppressing occurrence of deformation of a wiring pattern such as collapse or undulation.

Some embodiments of the present disclosure provide a manufacturing method of a ruthenium wiring capable of easily performing planarization after a ruthenium film is embedded in a recess such as a trench or the like.

According to one embodiment of the present disclosure, there is provided a ruthenium wiring, including: a TiON film formed as a base film in a recess formed in a predetermined film on a surface of a substrate; and a ruthenium film formed on the TiON film so as to fill the recess.

According to another embodiment of the present disclosure, there is provided a method of manufacturing a ruthenium wiring by filling a recess formed in a predetermined film, a substrate having the predetermined film in a surface of the substrate, including forming a TiON film as a base film on at least a surface of the recess; and forming a ruthenium film on the TiON film so as to fill the recess.

According to yet another embodiment of the present disclosure, there is provided a method of manufacturing a ruthenium wiring by filling a recess formed in a predetermined film, a substrate having the predetermined film a surface of the substrate, including: forming a base film on at least a surface of the recess; forming a ruthenium film on the base film so as to fill the recess; and after the ruthenium film is formed to fill the recess, planarizing the surface of the substrate by removing the ruthenium film and the base film which are formed on the surface of the substrate through a process including an argon plasma process.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart schematically showing a method of manufacturing a Ru wiring according to a first embodiment of the present disclosure.

FIGS. 2A to 2E are process sectional views schematically showing the method of manufacturing a Ru wiring according to the first embodiment of the present disclosure.

FIG. 3 is a view showing the relationships between a film thickness and a film stress with respect to a TiN film and TiON films (containing 46 at % of oxygen and 55 at % of oxygen).

FIG. 4 is a timing chart showing an example of a sequence of a TiON film forming method.

FIG. 5 is a flowchart showing an example of the sequence of the TiON film forming method.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Initially, a first embodiment of the present disclosure will be described.

[Method of Manufacturing Ru Wiring and Ru Wiring Structure According to First Embodiment]

First, a method of manufacturing a Ru wiring and a Ru wiring structure according to a first embodiment of the present disclosure will be described. FIG. 1 is a flowchart schematically showing a method of manufacturing a Ru wiring according to a first embodiment of the present disclosure, and FIGS. 2A to 2E are process sectional views thereof.

Figure 2A:
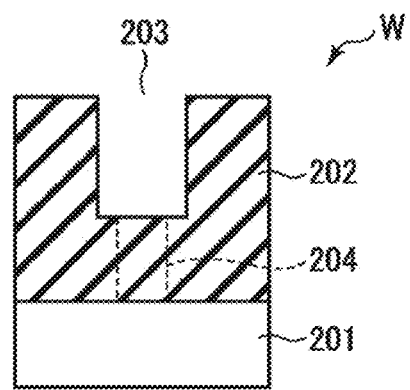
Figure 2B:
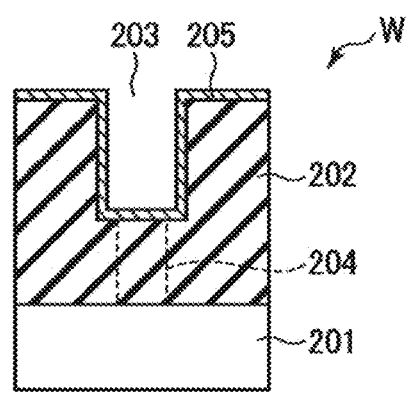

First, a semiconductor wafer (hereinafter simply referred to as "wafer") W is prepared in which an interlayer insulating film 202 made of a $SiO_2$ film, a low dielectric constant (low-k) film (a SiCO film, a SiCOH film or the like), or the like is formed on a substrate 201 having a lower structure (not shown), a trench 203 is formed in the interlayer insulating film 202 in a predetermined pattern, and via holes 204 are formed at predetermined intervals between a bottom portion of the trench 203 and the lower structure on the substrate 201 (Step S1 and FIG. 2A).

Next, if necessary, a degassing process or a pre-cleaning process as a pretreatment is performed on the wafer W. Then, a TiON film 205 as a base film for improving adhesion of a Ru film is formed on an entire surface including surfaces of the trench 203 and the via holes 204 by, for example, atomic layer deposition (ALD) method (Step S2 and FIG. 2B).

Figure 2C:
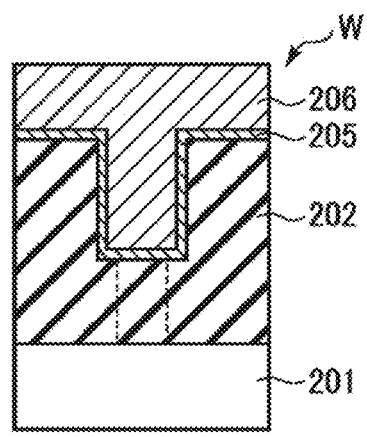

Thereafter, a Ru film 206 is formed by, for example, chemical vapor deposition (CVD) method, to embed the Ru film 206 in the trench 203 and the via holes 204 (Step S3 and FIG. 2C).

Figure 2D:
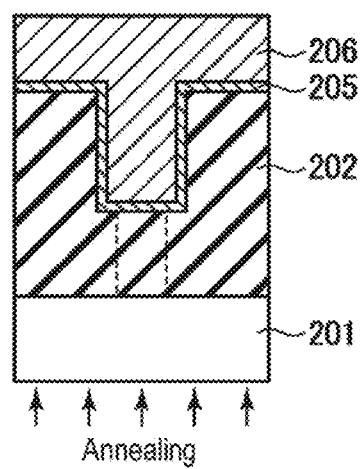

After forming the Ru film 206, an annealing process is performed as necessary (Step S4 and FIG. 2D). The annealing process stabilizes the Ru film 206.

Thereafter, for example, the entire front surface of the wafer W is polished by, for example, CMP which is conventionally used for manufacturing a Cu wiring, to remove portions of the Ru film 206 and the TiON film 205 above the front surface of the interlayer insulating film 202, thereby performing planarization (Step S5 and FIG. 2E). As a result, a Ru wiring 207 composed of the TiON film 205 as a base film and the Ru film 206 is formed in the trench 203 and the via holes 204. However, the planarization process is not limited to the CMP. For example, the planarization process may be performed by an argon (Ar) plasma treatment as shown in a second embodiment to be described later. Alternatively, the CMP may be performed after performing the Ar plasma treatment. Ar ion sputtering is preferred as the Ar plasma treatment.

In such a Ru wiring 207, a tensile stress of about 1.3 GPa acts on the Ru film 206. In this case, if a TiN film is used as the base film of the Ru film, a tensile stress of about 1.3 GPa acts on the TiN film in a same manner as the Ru film. Therefore, when the TiN filth is used as the base film and the Ru film is stacked on the TiN film, a large stress is applied to the Ru wiring due to the combination of the stresses acting on both the Ru film and the TiN film. If the stress of a wiring is large, there is a concern that deformation of a wiring pattern such as collapse or undulation occurs. In particular, when wirings become finer, the interval between the wirings becomes shorter so that wiring deformation is more likely to occur.

On the other hand, in the TiON film 205 used in the present embodiment, the stress acting in the tensile direction is smaller than that of the TiN film. It is therefore possible to reduce the stress acting on the film laminated with the Ru film and to reduce deformation of the wiring structure caused by the stress. In addition, by adjusting the amount of oxygen (O) in the film, it is possible to control the stress acting in the film and to effectively suppress deformation of the wiring structure caused by the stress.

Specifically, when the amount of O in the TiON film 205 is less than 50 at %, the crystal structure of TiON is cubic crystal which is same as that of TiN, and a relatively large tensile stress smaller than the tensile stress acting on TiN film acts on the TiON film 205. On the other hand, when the amount of O in the TiON film 205 is 50 at % or more, the crystal structure of TiON is changed from cubic crystal to tetragonal crystal, the stress acting on the TiON film 205 sharply decreases, and the stress becomes a compressive stress depending on the film thickness.

FIG. 3 shows the relationship between a film thickness and a film stress in the TiN film and the TiON films (containing 46 at % of O and 55 at % of O). As shown in FIG. 3, in the TiON film, due to the addition of O, the absolute value of the stress acting on the TiON film tends to become smaller than that of the TiN film. Especially, when the O content is 55 at % which is larger than 50 at %, the stress is almost 0 in a portion where the film thickness is thin. When the film thickness exceeds 10 nm, the stress becomes a compressive stress.

For this reason, by using the TiON film as the base film and preferably by setting the amount of O in the TiON film to 50 at % or more, as compared with the case of using the TiN film, the stress of the film laminated with the Ru film becomes smaller. Therefore, it is possible to limit deformation of the wiring structure caused by the film stress. In addition, since the TiON film is relatively low in electric resist, it is suitable as a film used for a wiring.

(Film Forming Process of TiON Film)

Next, a film forming process of the TiON film 205 formed as a base film of the Ru film will be described. The TiON film 205 is preferably formed by a method of introducing the wafer W into a chamber and repeating, by a plurality of cycles (Y cycles), a cycle of alternately repeating the supply of a Ti-containing gas and the supply of a nitriding gas across a purge a plurality of times (X times), supplying an oxidizing agent, and performing a purge thereafter.

By adopting such a film forming method, if the number of X times is adjusted, it is possible to easily control the amount of oxygen (O) in the film, such that it is possible to easily control the stress acting on the film. The amount of O may be adjusted by adjusting the supply amount of the oxidizing agent, the supply time of the oxidizing agent, or both, as well as by adjusting the number of X times. The thickness of the TiON film 205 is preferably 1 to 10 nm, more preferably 1 to 5 nm.

It will be described in detail below. As the Ti-containing gas, a titanium tetrachloride ($TiCl_4$) gas may be suitably used. As well as the $TiCl_4$ gas, tetra (isopropoxy) titanium (TTIP), titanium tetrabromide ($TiBr_4$), titanium tetraiodide ($TiI_4$), tetrakisethylmethylaminotitanium (TEMAT), tetrakisdimethylaminotitanium (TDMAT), tetrakisdiethylaminotitanium (TDEAT) or the like may be used. As the nitriding gas, an $NH_3$ gas may be suitably used. As well as the $NH_3$ gas, monomethyl hydrazine (MMH) may be used. As the oxidizing agent, an oxygen-containing gas such as an $O_2$ gas, an $O_3$ gas, a $H_2O$, $NO_2$ or the like may be used. The oxygen-containing gas may be turned into plasma and may be used as the oxidizing agent. As the purge gas, a rare gas such as an $N_2$ gas, an Ar gas or the like may be used.

An example of a sequence for forming a TiON film will be described with reference to the timing chart of FIG. 4 and the flowchart of FIG. 5.

First, a $TiCl_4$ gas, which is a Ti-containing gas, is supplied to the chamber and adsorbed on the wafer W (Step S21). Then, the supply of $TiCl_4$ gas is stopped and an interior of the chamber is purged with an $N_2$ gas as a purge gas (Step S22). Then, a nitriding gas, for example, an $NH_3$ gas, is supplied to the chamber and reacted with the adsorbed $TiCl_4$ to form TiN (Step S23). Then, the supply of the $NH_3$ gas is stopped and the interior of the chamber is purged with the $N_2$ gas (Step S24). These steps S21 to S24 are repeated X times. Thereafter, an $O_2$ gas, which is an oxidizing agent, is supplied to the chamber to perform an oxidation process (Step S25). Then, the interior of the chamber is purged (Step S26). This cycle as one cycle is repeated by Y cycles to form a TiON film having a desired thickness.

Figure 6:
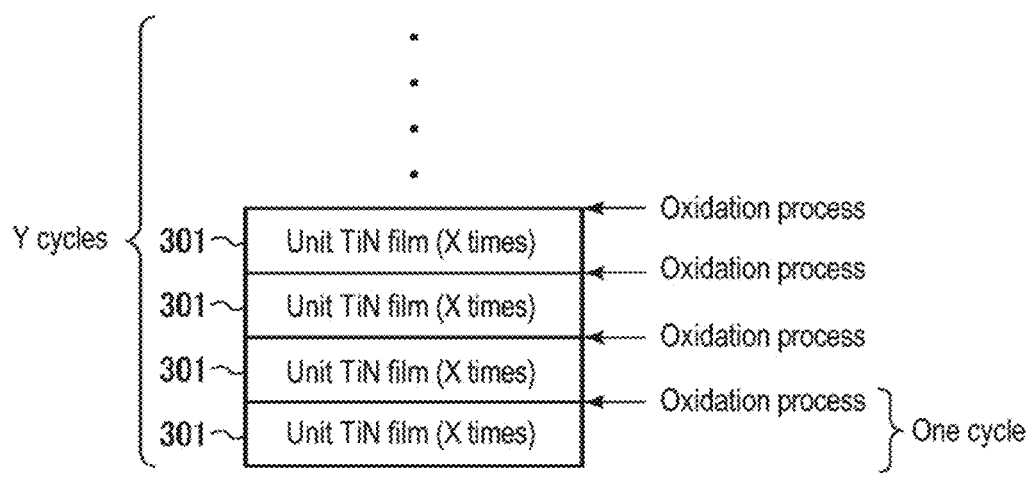
FIG. 6 is a schematic view showing a film formation state when a TiON film is formed by the sequence shown in FIGS. 4 and 5.

The film formation state at this time is shown in FIG. 6. As shown in FIG. 6, by repeating steps S21 to S24 X times, a unit TiN film 301 having a predetermined film thickness is formed. Then, the unit TiN film 301 is oxidized by performing the oxidation process in Step S25 and the purging in Step S26. By performing this one cycle by Y cycles, a TiON film having a predetermined film thickness is formed. At this time, the oxygen amount of the TiON film can be adjusted by X which is the number of repetitions of steps S21 to S24. That is, when X is decreased, the frequency of oxidation increases so that the amount of oxygen introduced into the film increases. Conversely, when X is increased, the amount of oxygen introduced into the film decreases. For example, when X is 1, the amount of O in the film may be about 62 at %. When X is 9, the amount of O in the film may be about 50 at %. The above-mentioned TiON film of the example of FIG. 3 is formed by such a method. When O is 46 at %, X is 12. When O is 55 at %, X is 6. The amount of O in the film may also be adjusted by adjusting the supply amount of the oxidizing agent, the supply time of the oxidizing agent, or both, as well as by adjusting the number of X times as described above.

Further, after repeating steps S21 to S24, the film thickness may be adjusted by the cycle number Y of a cycle in which steps S25 and S26 are performed.

The oxidation process in Step S25 and the purging in Step S26 may be repeated a plurality of times (N times). As a result, the supply efficiency of the oxidizing agent is enhanced and the oxidizing efficiency can be enhanced.

Further, at the time of forming the TiON film, adjustment such as changing of X or the like may be made in the course of film formation in order to adjust the oxidation of TiN. In addition to the basic steps of the aforementioned steps S21 to S26, it may be possible to add an additional step in order to enhance oxidizing or nitriding.

Preferable ranges of film forming conditions in the case of using a $TiCl_4$ gas as a Ti source gas, using an $NH_3$ gas as a nitriding gas, using an $N_2$ gas as a carrier gas or a purge gas, and using an $O_2$ gas as an oxidizing agent are as follows.

Processing temperature (susceptor temperature): 300 to 500 degrees C.

Chamber pressure: 13.33 to 1333 Pa (0.1 to 10 Torr)

$TiCl_4$ gas flow rate: 10 to 300 mL/min (sccm)

$NH_3$ gas flow rate: 1000 to 10000 mL/min (sccm)

$N_2$ gas flow rate: 1000 to 30000 mL min (sccm)

One supply time of steps S21 to S24: 0.01 to 3 sec $O_2$ gas flow rate: 10 to 3000 mL/min (sccm)

$O_2$ gas supply time: 0.1 to 60 sec (Film Forming Process of Ru Film)

Next, a film forming process of the Ru film 206 will be described. The Ru film 206 is preferably formed by thermal CVD using ruthenium carbonyl ($Ru_3(CO)_{12}$) as a film forming source. As a result, a high-purity thin Ru film may be formed with a high step coverage. Film forming conditions at this time include, for example, an internal pressure of a processing chamber falling in a range of 1.3 to 66.5 Pa and a film forming temperature (wafer temperature) falling in a range of 130 to 250 degrees C. The Ru film 206 may be formed of a film forming source other than ruthenium carbonyl, for example, ruthenium pentadienyl compounds such as (cyclopentadienyl) (2,4-dimethylpentadienyl) ruthenium, bis(cyclopentadienyl) (2,4-methylpentadienyl) ruthenium, (2,4-dimethylpentadienyl) (ethylcyclopentadienyl) ruthenium, bis (2,4-methylpentadienyl) (ethylcyclopentadienyl) ruthenium or the like. The CVD referred to herein includes ALD.

[Film Forming System]

Next, an example of a film forming system used for performing a method of manufacturing a Ru wiring according to the first embodiment will be described.

Figure 7:
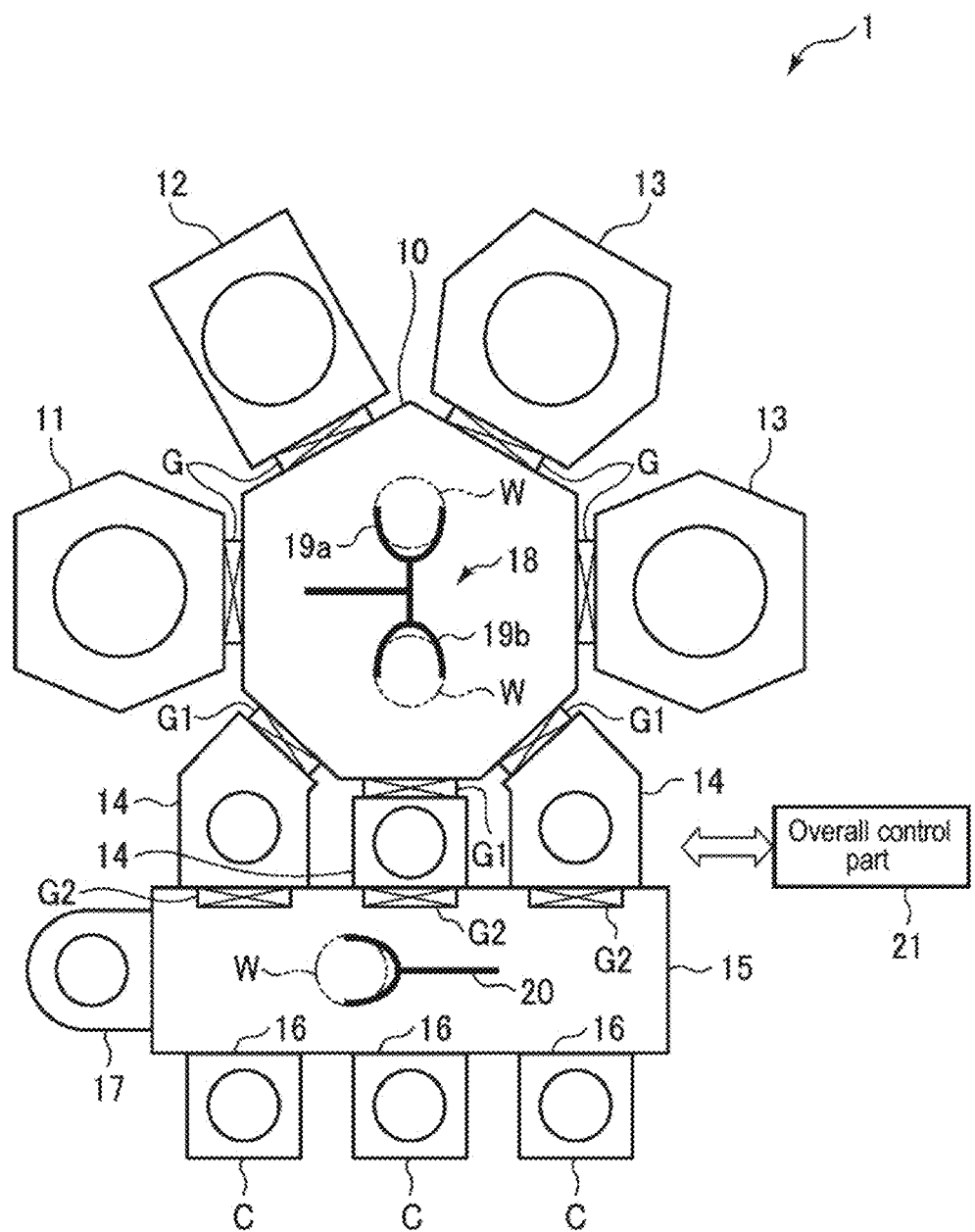
FIG. 7 is a horizontal sectional view schematically showing an example of a film forming system used for performing the method of manufacturing a Ru wiring according to the first embodiment.

FIG. 7 is a horizontal sectional view schematically showing an example of such a film forming system. The film forming system 1 includes one TiON film forming apparatus 11, one cooling apparatus 12, and two Ru film forming apparatuses 13. These apparatuses are connected to four wall portions of a vacuum transfer chamber 10 having a heptagonal plane shape via gate valves G, respectively. An interior of the vacuum transfer chamber 10 is evacuated by a vacuum pump and maintained at a predetermined degree of vacuum.

Since there is a difference in processing temperature between the TiON film forming apparatus 11 and the Ru film forming apparatus 13, the cooling apparatus 12 is configured to first cool the wafer W processed in the TiON film forming apparatus 11 to room temperature before the wafer W is transferred to the Ru film forming apparatus 13. The cooling apparatus 12 has a structure in which a cooling plate on which the wafer W is mounted is provided in a chamber maintained at vacuum. The TiON film forming apparatus 11 and the Ru film forming apparatus 13 will be described later.

Three load lock chambers 14 are connected to the remaining three wall portions of the vacuum transfer chamber 10 via gate valves G1. At the opposite side of the vacuum transfer chamber 10 across the load lock chambers 14, an atmospheric transfer chamber 15 is provided. The three load lock chambers 14 are connected to the atmospheric transfer chamber 15 via gate valves G2. The load lock chambers 14 are configured to control the pressure between the atmospheric pressure and the vacuum when the wafer W is transferred between the atmospheric transfer chamber 15 and the vacuum transfer chamber 10.

On a wall portion of the atmospheric transfer chamber 15 opposite to a wall portion where the load lock chambers 14 are mounted, there are three carrier mounting ports 16 for mounting carriers (FOUPs or the like) C which accommodate wafers W. On a side wall of the atmospheric transfer chamber 15, an alignment chamber 17 for aligning the silicon wafer V is provided. A down-flow of clean air is formed in the atmospheric transfer chamber 15.

In the vacuum transfer chamber 10, a transfer mechanism 18 is provided. The transfer mechanism 18 transfers the wafer W with respect to the TiON film forming apparatus 11, the cooling apparatus 12, the Ru film forming apparatuses 13 and the load lock chambers 14. The transfer mechanism 18 includes two transfer arms 19a and 19b capable of moving independently.

In the atmospheric transfer chamber 15, a transfer mechanism 20 is provided. The transfer mechanism 20 is configured to transfer the wafer W with respect to the carriers C, the load lock chambers 14 and the alignment chamber 17.

The film forming system 1 includes an overall control part 21. The overall control part 21 includes: a main control part including a CPU (computer) for controlling the respective constituent parts of the TiON film forming apparatus 11, the cooling apparatus 12 and the Ru film forming apparatuses 13, an exhaust mechanism and the transfer mechanism 18 of the vacuum transfer chamber 10, exhaust mechanisms and gas supply mechanisms of the load lock chambers 14, the transfer mechanism 20 of the atmospheric transfer chamber 15, and a drive system of the gate valves G, G1 and G2, and the like; an input device (a keyboard, a mouse, etc.); an output device (a printer, etc.); a display device (a display, etc.); and a memory device (storage medium). The main control part of the overall control part 21 causes the film forming system 1 to execute predetermined operations based on, for example, a process recipe stored in a storage medium built in a memory device or a storage medium set in a memory device.

Next, the operation of the film forming system configured as above will be described. The following processing operation is executed based on the process recipe stored in the storage medium of the overall control part 21.

First, the wafer W is taken out from the carrier C connected to the atmospheric transfer chamber 15 by the transfer mechanism 20. The gate valve G2 of one of the load lock chambers 14 is opened, and the wafer W is loaded into the load lock chamber 14. After closing the gate valve G2, the interior of the load lock chamber 14 is evacuated to vacuum.

When the load lock chamber 14 reaches a predetermined degree of vacuum, the gate valve G1 is opened, and the silicon wafer W is taken out from the load lock chamber 14 by one of the transfer arms 19a and 19b of the transfer mechanism 18 in the vacuum transfer chamber 10.

Then, the gate valve G of the TiON film forming apparatus 11 is opened, and the silicon wafer W held by one of the transfer arms 19a and 19b of the transfer mechanism 18 is loaded into the TiON film forming apparatus 11. The gate valve G is closed, and a TiON film is formed by the TiON film forming apparatus 11.

After the film forming process of the TiON film is completed, the gate valve G is opened, and the wafer W is unloaded by one of the transfer arms 19a and 19b of the transfer mechanism 18. The gate valve G of the cooling apparatus 12 is opened, and the wafer W is loaded into the cooling apparatus 12. After cooling the wafer W in the cooling apparatus 12, the wafer W is unloaded by one of the transfer arms 19a and 19b of the transfer mechanism 18. The gate valve G of one of the Ru film forming apparatuses 13 is opened, and the wafer W is loaded into the Ru film forming apparatus 13. Then, a Ru film is formed by the Ru film forming apparatus 13.

After the Ru film is formed, the gate valve G of the Ru film forming apparatus 13 is opened, and the wafer W in the Ru film forming apparatus 13 is unloaded by one of the transfer arms 19a and 19b of the transfer mechanism 18. Subsequently, the gate valve G1 of one of the load lock chambers 14 is opened, and the silicon wafer W held on the transfer arm is loaded into the load lock chamber 14. Then, an internal pressure of the load lock chamber 14 is returned to atmospheric pressure. The gate valve G2 is opened, and the silicon wafer W in the load lock chamber 14 is returned to the carrier C by the transfer mechanism 20.

The above process is performed concurrently in parallel with respect to a plurality of silicon wafers W. The TiON film forming process and the Ru film forming process with respect to of a predetermined number of wafers W are completed.

After completing the Ru film formation as described above, annealing is performed as necessary. After that, the carrier C is transferred to a CMP apparatus where the wafer W is subjected to a CMP process. The annealing may be performed by any module in the film forming system 1 or may be performed by a separately provided annealing apparatus.

(TiON Film Forming Apparatus)

Figure 8:
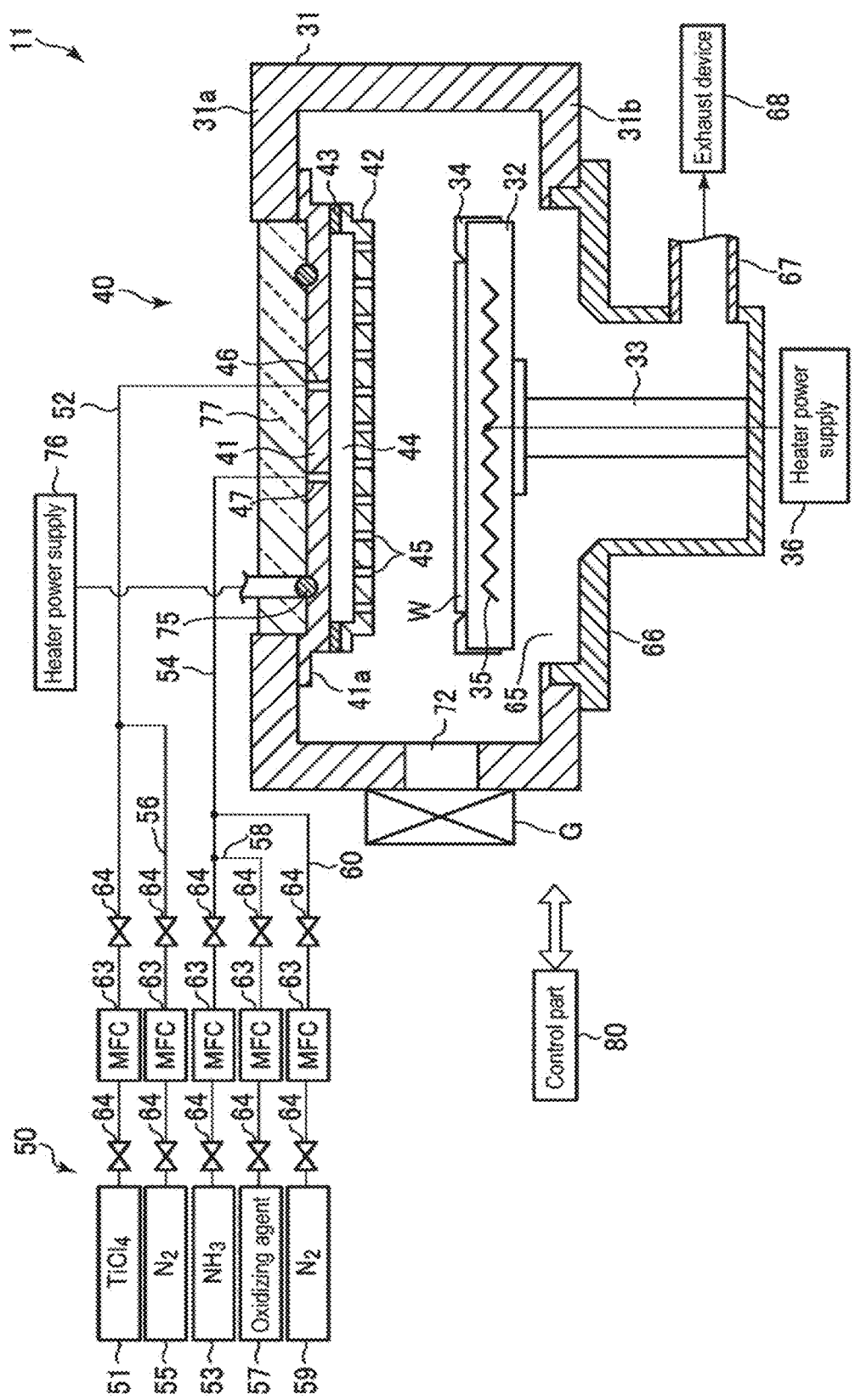
FIG. 8 is a sectional view schematically showing an example of a TiON film forming apparatus mounted in the film forming system of FIG. 7.

Next, the TiON film forming apparatus 11 of the film forming system 1 will be described. FIG. 8 is a sectional view schematically showing an example of the TiON film forming apparatus 11.

The TiON film forming apparatus 11 includes a substantially cylindrical chamber 31 having an airtight configuration. In an interior of the chamber 31, as a stage for horizontally supporting the wafer W which is a substrate to be processed, a susceptor 32 made of ceramics such as AlN or the like is disposed while being supported by a cylindrical support member 33 provided in a central lower portion of the susceptor 32. A guide ring 34 for guiding the wafer W is provided in an outer edge portion of the susceptor 32. A heater 35 is embedded in the susceptor 32. The heater 35 is configured to heat the wafer W, which is a substrate to be processed, to a predetermined temperature using electric power supplied from a heater power supply 36. In the susceptor 32, a plurality of wafer lift pins (not shown) for supporting and moving the wafer W up and down is provided so as to protrude and retract with respect to a surface of the susceptor 32.

A shower head 40 is provided on a ceiling wall 31a of the chamber 31. The shower head 40 includes a base member 41 and a shower plate 42. An outer peripheral portion of the shower plate 42 is screw-fixed to the base member 41 via an intermediate member 43. The shower plate 42 has a flange shape. A recess is formed in the shower plate 42. A gas diffusion space 44 is formed between the base member 41 and the shower plate 42. A flange portion 41a is formed on an outer periphery of the base member 41. The flange portion 41a is attached to the ceiling wall 31a of the chamber 31. A plurality of gas discharge holes 45 is formed in the shower plate 42. Two gas introduction holes 46 and 47 are formed in the base member 41.

A gas supply mechanism 50 includes a $TiCl_4$ gas supply source 51 for supplying a $TiCl_4$ gas as a Ti-containing gas, and an $NH_3$ gas supply source 53 for supplying an $NH_3$ gas as a nitriding gas. A $TiCl_4$ gas supply line 52 is connected to the $TiCl_4$ gas supply source 51. The $TiCl_4$ gas supply line 52 is connected to the first gas introduction hole 46. An $NH_3$ gas supply line 54 is connected to the $NH_3$ gas supply source 53. The $NH_3$ gas supply line 54 is connected to the second gas introduction hole 47.

An $N_2$ gas supply line 56 is connected to the $TiCl_4$ gas supply line 52. An $N_2$ gas is supplied as a carrier gas or a purge gas from an $N_2$ gas supply source 55 to the $N_2$ gas supply line 56.

An oxidizing agent supply line 58 is connected to the $NH_3$ gas supply line 54. The aforementioned oxygen-containing gas is supplied as an oxidizing agent from an oxidizing agent supply source 57 to the oxidizing agent supply line 58. The oxygen-containing gas may be turned into plasma. At this time, the oxygen-containing gas that turns into plasma in advance may be supplied from the oxidizing agent supply source 57. Alternatively, the oxygen-containing gas may be turned into plasma in the shower head 40. An $N_2$ gas supply line 60 is connected to the $NH_3$ gas supply line 54. An $N_2$ gas is supplied as a carrier gas or a purge gas from an $N_2$ gas supply source 59 to the $N_2$ gas supply line 60.

A mass flow controller 63 and two valves 64 that sandwich the mass flow controller 63 are provided in each of the $TiCl_4$ gas supply line 52, the $NH_3$ gas supply line 54, the oxidizing agent supply line 58 and the $N_2$ gas supply lines 56 and 60.

Accordingly, the $TiCl_4$ gas from the $TiCl_4$ gas supply source 51 and the $N_2$ gas from the $N_2$ gas supply source 55 are supplied from the first gas introduction hole 46 of the shower head 40 to the gas diffusion space 44 in the shower head 40 through the $TiCl_4$ gas supply line 52. The $NH_3$ gas from the $NH_3$ gas supply source 53, the oxidizing agent from the oxidizing agent supply source 57 and the $N_2$ gas from the $N_2$ gas supply source 59 are supplied from the second gas introduction hole 47 of the shower head 40 to the gas diffusion space 44 in the shower head 40 through the $NH_3$ gas supply line 54. These gases are discharged into the chamber 31 from the gas discharge holes 45 of the shower plate 42. The shower head 40 may be a post-mix type in which the $TiCl_4$ gas and the $NH_3$ gas are independently supplied into the chamber 31.

The base member 41 of the shower head 40 is provided with a heater 75 for heating the shower head 40. A heater power supply 76 is connected to the heater 75. The shower head 40 is heated to a desired temperature by supplying electric power from the heater power supply 76 to the heater 75. A heat insulating member 77 is provided in a recess formed in an upper portion of the base member 41 in order to increase heating efficiency of the heater 75.

A circular hole 65 is formed in a central portion of a bottom wall 31b of the chamber 31. An exhaust chamber 66 protruding downward is provided in the bottom wall 31b so as to cover the hole 65. An exhaust pipe 67 is connected to a side surface of the exhaust chamber 66. An exhaust device 68 is connected to the exhaust pipe 67. By operating the exhaust device 68, it is possible to reduce an internal pressure of the chamber 31 to a predetermined degree of vacuum.

A loading/unloading port 72 for loading and unloading the wafer W between the chamber 31 and the vacuum transfer chamber 10 is provided on a sidewall of the chamber 31. As described above, the loading/unloading port 72 is opened and closed by the gate valve G.

The TiON film forming apparatus 11 includes a control part 80 configured to control the respective constituent parts thereof, for example, the heater power supplies 36 and 76, the valves 64, the mass flow controllers 63, and the like. The control part 80 controls the respective constituent parts in response to a command from the overall control part 21.

In the TiON film forming apparatus 11 configured as above, the gate valve G is opened, and the wafer W is loaded from the vacuum transfer chamber 10 into the chamber 31 via the loading/unloading port 72 by the transfer mechanism 18. The wafer W is mounted on the susceptor 32. The susceptor 32 is heated to a predetermined temperature by the heater 35. In a state in which the wafer W is mounted on the susceptor 32, the $N_2$ gas is supplied into the chamber 31 and the wafer W is heated. When the temperature of the wafer W is substantially stabilized, the formation of the TiON film is started.

First, the $TiCl_4$ gas is supplied from the $TiCl_4$ gas supply source 51 to the chamber 31 so that the $TiCl_4$ gas is adsorbed on the wafer W. Then, the supply of the $TiCl_4$ gas is stopped, and the interior of the chamber 31 is purged with the $N_2$ gas. Then, the $NH_3$ gas is supplied from the $NH_3$ gas supply source 53 to the chamber 31 and reacted with the adsorbed $TiCl_4$ to form TiN. Then, the supply of the $NH_3$ gas is stopped, and the interior of the chamber 31 is purged with the $N_2$ gas. These steps are repeated X times. Thereafter, the oxidizing agent (for example, an $O_2$ gas) is supplied from the oxidizing agent supply source 57 to the chamber 31 to perform an oxidation process. Then, the interior of the chamber 31 is purged. This cycle as one cycle is repeated by Y cycles to form a TiON film having a predetermined film thickness.

At this time, as described above, by controlling the number of X times and the like, it is possible to control the O amount of the TiON film and to control the stress acting on the TiON film.

After the film forming process is completed, the interior of the chamber 31 is purged. The gate valve G is opened, and the wafer W is unloaded through the loading/unloading port 72 by the transfer mechanism 18.

(Ru Film Forming Apparatus)

Figure 9:
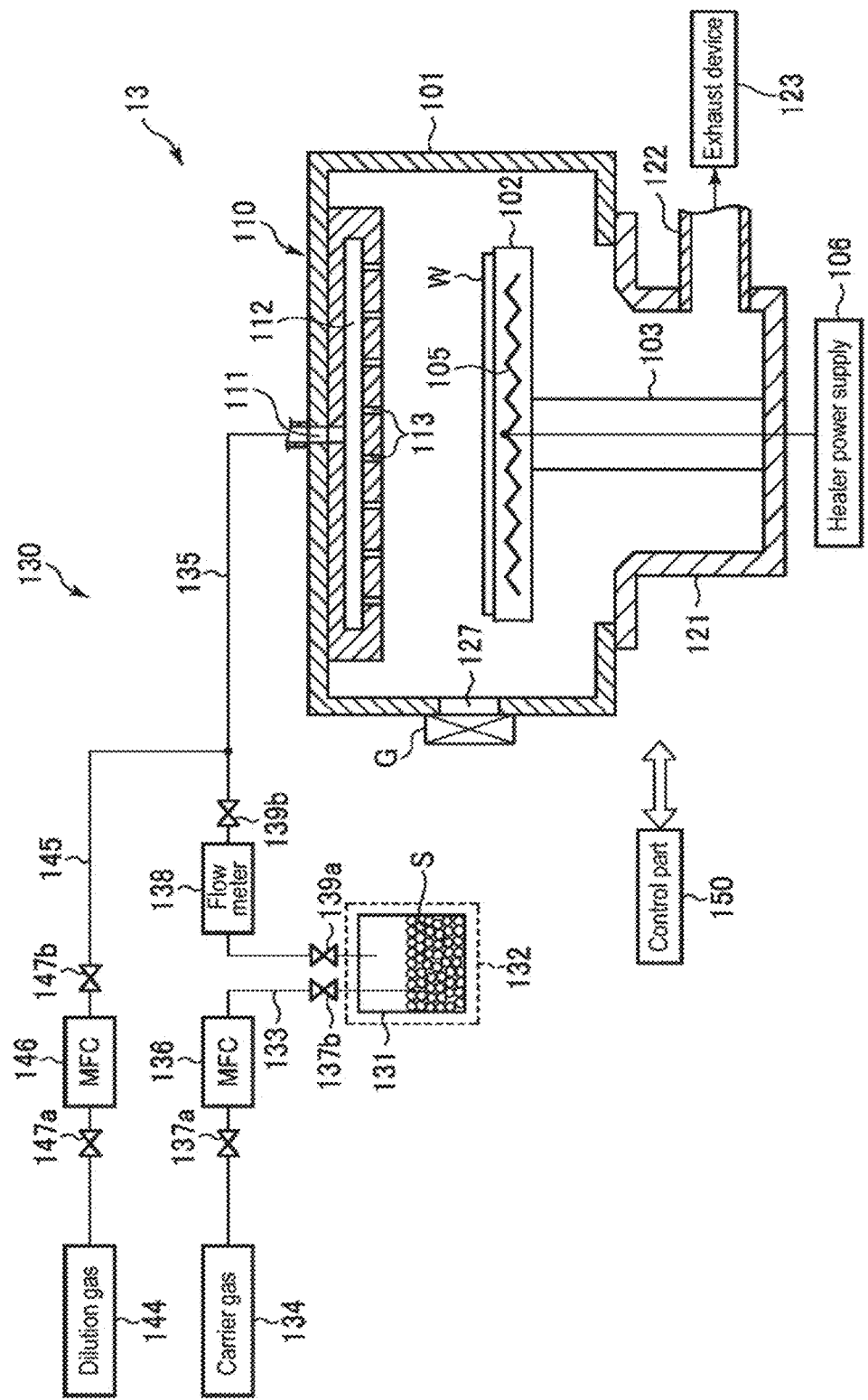
FIG. 9 is a sectional view schematically showing an example of a Ru film forming apparatus mounted in the film forming system of FIG. 7.

Next, the Ru film forming apparatus 13 of the film forming system 1 will be described. FIG. 9 is a sectional view schematically showing an example of the Ru film forming apparatus 13.

The Ru film forming apparatus 13 includes a substantially cylindrical chamber 101 having an airtight configuration. In an interior of the chamber 101, a susceptor 102 for horizontally supporting the wafer W which is a substrate to be processed is disposed while being supported by a cylindrical support member 103 provided at the center of a bottom wall of the chamber 101. A heater 105 is embedded in the susceptor 102. The heater 105 is configured to heat the wafer W, which is a substrate to be processed, to a predetermined temperature using electric power supplied from a heater power supply 106. In the susceptor 102, a plurality of wafer lift pins (not shown) for supporting and moving the wafer W up and down is provided so as to protrude and retract with respect to a surface of the susceptor 102.

On a ceiling wall of the chamber 101, a shower head 110 for introducing a process gas for CVD formation of a Ru film into the chamber 101 in a shower shape is provided while facing the susceptor 102. The shower head 110 is configured to discharge a gas supplied from a gas supply mechanism 130, which will be described later, into the chamber 101. A gas introduction port 111 for introducing the gas is formed in an upper portion of the shower head 110. Further, a gas diffusion space 112 is formed inside the shower head 110. A plurality of gas discharge holes 113 communicating with the gas diffusion space 112 is formed on a bottom surface of the shower head 110.

An exhaust chamber 121 protruding downward is provided in a bottom wall of the chamber 101. An exhaust pipe 122 is connected to a side surface of the exhaust chamber 121. An exhaust device 123 including a vacuum pump, a pressure control valve or the like is connected to the exhaust pipe 122. By operating the exhaust device 123, it is possible to keep the interior of the chamber 101 in a predetermined reduced pressure (vacuum) state.

A loading/unloading port 127 for loading and unloading the wafer W between the chamber 101 and the vacuum transfer chamber 10 is provided in a sidewall of the chamber 101. The loading/unloading port 127 is opened and closed by a gate valve G.

A gas supply mechanism 130 has a film formation source container 131 for storing ruthenium carbonyl $Ru_3(CO)_{12}$), which is in a solid state, as a film formation source S. A heater 132 is provided around the film formation source container 131. A carrier gas supply pipe 133 for supplying a carrier gas from above the film formation source container 131 is inserted into the film formation source container 131. A carrier gas supply source 134 for supplying a carrier gas is connected to the carrier gas supply pipe 133. As the carrier gas, an inert gas such as an Ar gas, an $N_2$ gas or the like, or a CO gas may be used. Further, a film formation source gas supply pipe 135 is inserted into the film formation source container 131. The film formation source gas supply pipe 135 is connected to a gas introduction port 111 of the shower head 110. Accordingly, the carrier gas is blown from the carrier gas supply source 134 into the film formation source container 131 via the carrier gas supply pipe 133. A ruthenium carbonyl $(Ru_3(CO)_{12})$ gas sublimated in the film formation source container 131 is carried by the carrier gas and is supplied into the chamber 101 through the film formation source gas supply pipe 135 and the shower head 110. A mass flow controller 136 for flow rate control and valves 137a and 137b located before and after the mass flow controller 136 are provided in the carrier gas supply pipe 133. In addition, a flow meter 138 for measuring the amount of the ruthenium carbonyl $(Ru_3(CO)_{12})$ gas and valves 139a and 139b located before and after the flow meter 138 are provided in the film formation source gas supply pipe 135.

The gas supply mechanism 130 further includes a dilution gas supply source 144 and a dilution gas supply pipe 145 connected to the dilution gas supply source 144. One end of the dilution gas supply pipe 145 is connected to the film formation source gas supply pipe 135. The dilution gas is a gas for diluting the film formation source gas. An inert gas such as an Ar gas, an $N_2$ gas or the like is used as the dilution gas. The dilution gas also functions as a purge gas for purging a residual gas in the film formation source gas supply pipe 135 and the chamber 101. A mass flow controller 146 for flow rate control and valves 147a and 147b located before and after the mass flow controller 146 are provided in the dilution gas supply pipe 145.

The Ru film forming apparatus 13 includes a control part 150 for controlling the respective constituent parts thereof, for example, the heater power supply 106, the exhaust device 123, the valves 137a, 137b, 139a, 139b, 147a and 147b of the gas supply mechanism 130, the mass flow controllers 136 and 146, and the like. The control part 150 controls the respective constituent parts in response to a command from the overall control part 21.

In the Ru film forming apparatus 13 configured as above, the gate valve G is opened, and the wafer W is loaded into the chamber 101 from the loading/unloading port 127. The wafer W is mounted on the susceptor 102. The susceptor 102 is heated by the heater 105 to a predetermined temperature, for example, a temperature falling within a range of 130 to 250 degrees C., and the inert gas is introduced into the chamber 101 thereby heating the wafer W. Then, the interior of the chamber 101 is exhausted by the vacuum pump of the exhaust device 123, and an internal pressure of the chamber 101 is adjusted to 2 to 67 Pa.

Next, by opening the valves 137a and 137b, the carrier gas is blown into the film formation source container 131 via the carrier gas supply pipe 133. The $Ru_3(CO)_{12}$ gas produced in the film formation source container 131 through sublimation by the heating of the heater 132 is carried by the carrier gas and introduced into the chamber 101 via the film formation source gas supply pipe 135 and the shower head 110. As a result, on the surface of the wafer W, Ru generated by thermal decomposition of the $Ru_3(CO)_{12}$ gas is deposited to form a Ru film having a predetermined film thickness.

After completing the film forming process, the interior of the chamber 101 is purged. The gate valve G is opened, and the wafer W is unloaded through the loading/unloading port 127 by the transfer mechanism 18.

Second Embodiment

Next, a second embodiment of the present disclosure will be described.

[Method of Manufacturing Ru Wiring According to Second Embodiment]

Figure 10:
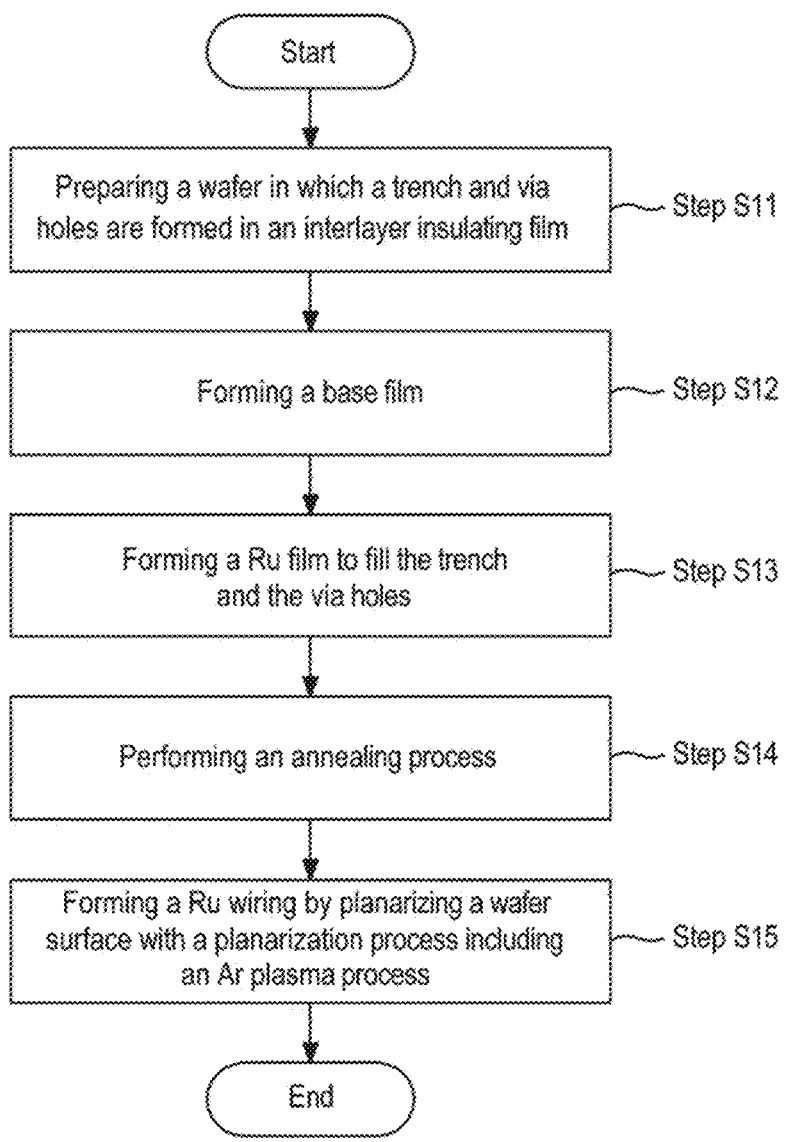
FIG. 10 is a flowchart schematically showing a method of manufacturing a Ru wiring according to a second embodiment of the present disclosure.

First, a method of manufacturing a Ru wiring according to a second embodiment of the present disclosure will be described. FIG. 10 is a flowchart schematically showing a method of manufacturing a Ru wiring according to a second embodiment of the present disclosure, and FIGS. 11A to 11E are process sectional views thereof.

The basic process of the method of manufacturing the Ru wiring according to the second embodiment is the same as that of the first embodiment. However, the second embodiment differs from the first embodiment in that the base film is not limited to the TiON film and the planarization process is performed by Ar ion sputtering.

Figure 11A:
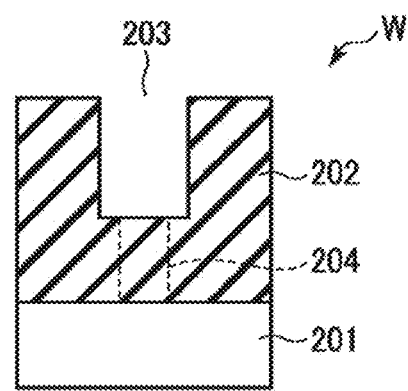
FIGS. 11A to 11E are process sectional views schematically showing the method of manufacturing a Ru wiring according to the second embodiment of the present disclosure.
Figure 11B:
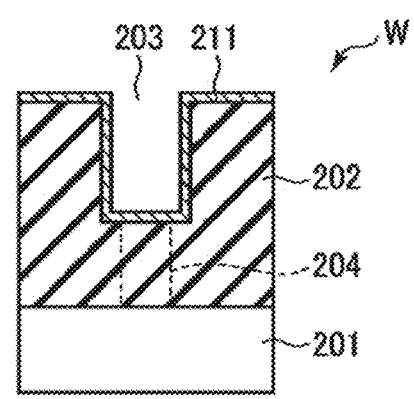

First, as in Step S1 of the first embodiment, a wafer W is prepared in which an interlayer insulating film 202 made of a $SiO_2$ film, a low dielectric constant (low-k) film (a SiCO film, a SiCOH film or the like), or the like is formed on a substrate 201 having a lower structure (not shown), a trench 203 is formed in the interlayer insulating film 202 in a predetermined pattern, and via holes 204 are formed at predetermined intervals between a bottom portion of the trench 203 and the lower structure on the substrate 201 (Step S11 and FIG. 11A).

Next, if necessary, a degassing process or a pre-cleaning process as a pretreatment is performed on the wafer W. Then, a base film 211 for improving adhesion of a Ru film is formed on the entire exposed surface including surfaces of the trench 203 and the via holes 204 (Step S12 and FIG. 11B).

The base film 211 may be any material as long as it can improve the adhesion of the Ru film. As the base film 211, it may be possible to suitably use a TiN film, a Ta film, a TaN film and a TaAlN film, which are conventionally used as a barrier film of a Cu film at the time of forming a Cu wiring, and the TiON film used in the first embodiment or the like. The thickness of the base film 211 is preferably 0.1 to 10 nm, more preferably 0.5 to 5 nm. The base film may be formed by ALD, CVD, ionized physical vapor deposition (iPVD), or the like. The TiN film, the TaN film and the TiON film are preferably formed by ALD. The Ta film is preferably formed by iPVD.

Figure 11C:
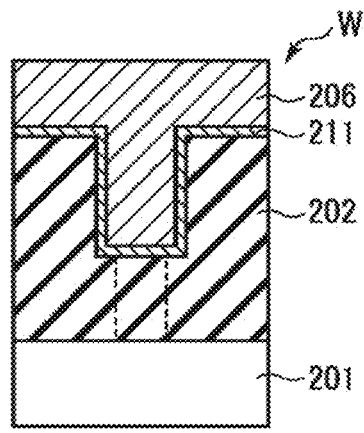
Figure 11D:
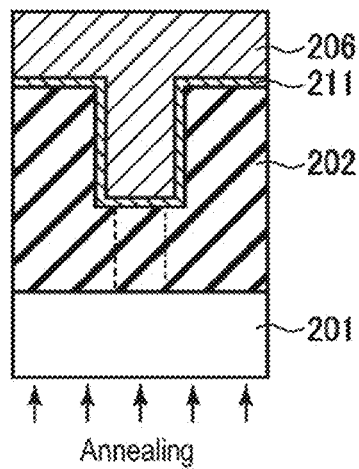

Thereafter, a Ru film 206 is formed by, for example, chemical vapor deposition (CVD) method, to embed the Ru film 206 in the trench 203 and the via holes 204 (Step S13 and FIG. 11C). The formation of the Ru film at this time is performed in the same manner as in Step S3 of the first embodiment.

After forming the Ru film 206, as in the first embodiment, an annealing process is performed as necessary (Step S14 and FIG. 11D) to stabilize the Ru film 206.

Figure 11E:
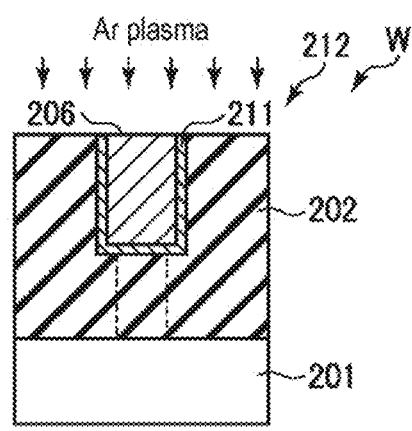

Thereafter, the Ru film 206 and the base film 211 on the surface are removed by a removal process including an Ar plasma process, thereby performing planarization (Step S15 and FIG. 11E). As a result, a Ru wiring 212 composed of the base film 211 and the Ru film 206 is formed in the trench 203 and the via holes 204.

In the conventional Cu wiring, CMP was used when planarization is performed by removing a barrier film and a Cu film on a surface after filling a trench with the Cu film. However, Ru is a noble metal and its ionization tendency is low. It is therefore difficult to remove a Ru film by CMP. A lot of time is needed if planarization after filling a Ru film in a trench is performed only by CMP.

Thus, in the present embodiment, an Ar plasma process is used for planarization. It is possible for Ar plasma to efficiently remove the Ru film 206 and the base film 211 on the surface.

As the Ar plasma process, Ar ion sputtering is preferred. In the Ar ion sputtering, argon plasma is generated in a chamber kept under vacuum. Ar ions in the plasma are drawn into a wafer disposed in the chamber. An object is physically removed by the impact of Ar ions at that time. Since the Ar ions have a high sputtering effect, it is possible to easily remove the Ru film or the like and to perform a planarization process in a short time.

Incidentally, in the related art, there is known an example in which a Ru film is formed and then planarized. As an example thereof, an etch-back method is known as well as CMP. However, the Ru film is used as an SN electrode, but there is no description on a planarization process for manufacturing a Ru wiring. In addition, in the related art, there is known dry etching of Ru performed by Ar ion sputtering. However, what is known in the related art is anisotropic etching for forming an upper metal electrode and is a technique having nothing to do with the planarization process for manufacturing a Ru wiring.

The planarization process may be carried out only by an Ar plasma process. However, in the case of using only the Ar plasma process, the surface may be roughened after the process and the desired surface smoothness may not be obtained in some cases.

In such a case, it is preferable to cans out CMP after performing Ar ion sputtering as the planarization process. That is, the desired surface smoothness can be obtained by efficiently carrying out a treatment by an Ar plasma process and then performing CMP for finishing. In this case, the CMP is used only for finishing. The polishing amount of about several nm is sufficient. Therefore, the planarization process does not take a long time.

[Ar Plasma Processing Apparatus]

Figure 12:
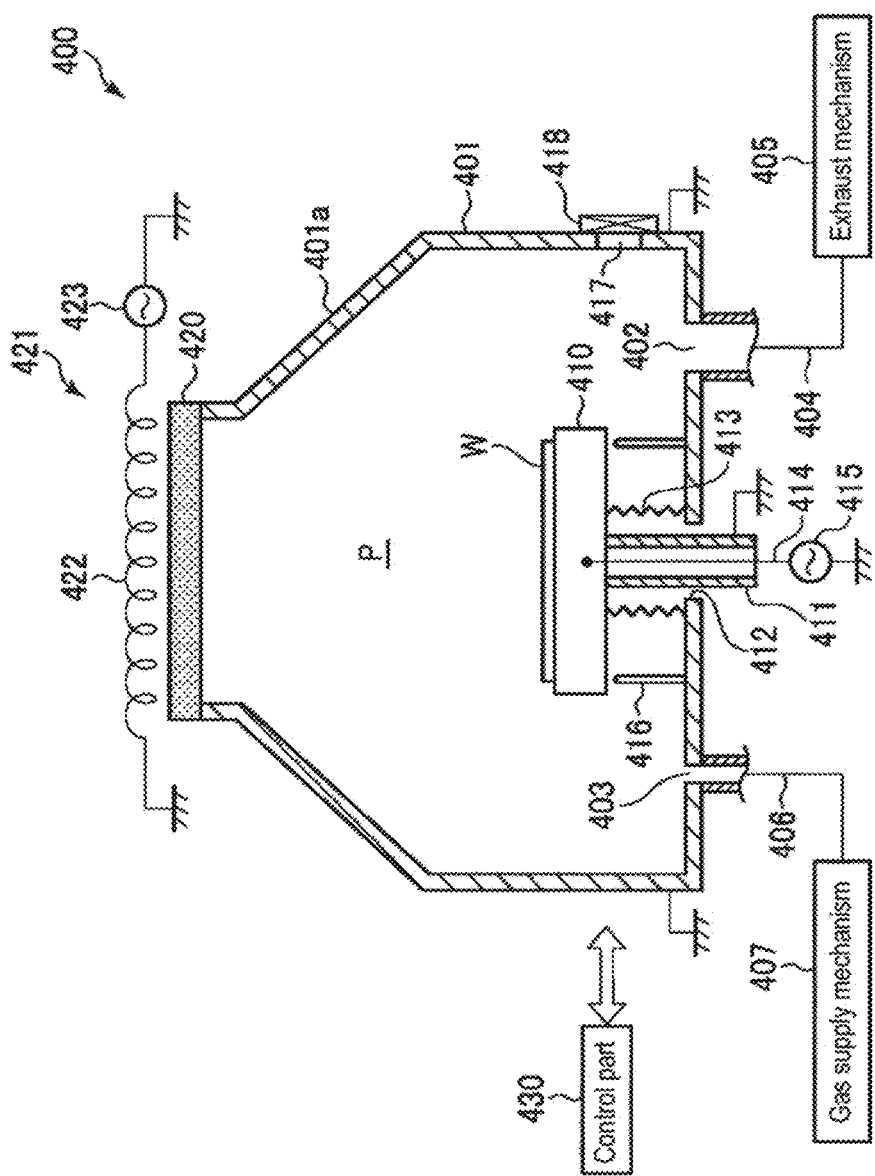
FIG. 12 is a sectional view showing an example of an Ar ion sputtering apparatus as an Ar plasma processing apparatus used for planarization in the second embodiment.

Next, an example of an apparatus for performing such an Ar plasma process will be described. FIG. 12 is a sectional view showing an example of an Ar ion sputtering apparatus as an Ar plasma processing apparatus used for a planarization process.

Herein, there will be described an example in which an ICP (Inductively Coupled Plasma) sputtering apparatus is used as an Ar ion sputtering apparatus.

As shown in FIG. 12, an Ar ion sputtering apparatus 400 includes a grounded chamber 401 made of metal such as aluminum or the like. An exhaust port 402 and a gas introduction port 403 are provided at a bottom of the chamber 401. An exhaust pipe 404 is connected to the exhaust port 402. An exhaust mechanism 405 including a throttle valve, a vacuum pump and the like for performing pressure regulation is connected to exhaust pipe 404. A gas supply pipe 406 is connected to the gas introduction port 403. A gas supply mechanism 407 for supplying a gas such as an Ar gas, an $N_2$ gas and the like is connected to the gas supply pipe 406.

A stage 410 made of an electrically conductive material and configured to mount a wafer W as a substrate to be processed is provided in the chamber 401. The stage 410 is provided with an electrostatic chuck for attracting wafers and a temperature control mechanism for wafer temperature adjustment (none of which is shown). At the center of a lower surface of the stage 410, a cylindrical support column 411 is provided. A lower portion of the support column 411 penetrates an insertion hole 412 formed at a center portion of the bottom of the chamber 401 and extends downward.

The support column 411 is configured to move up and down by a lifting mechanism (not shown), whereby the stage 410 moves up and down. A bellows 413 is provided between the stage 410 and the bottom of the chamber 401 so as to surround the support column 411.

A power supply line 414 is connected to the stage 410. The power supply line 414 extends downward through the inside of the support column 411. A bias high-frequency power supply 415 is connected to the power supply line 414. A high-frequency bias of, for example, 13.56 MHz, is applied from the bias high-frequency power supply 415 to the wafer W via the stage 410.

For example, three support pins 416 (only two of which are shown) are vertically provided in the bottom of the chamber 401 while facing upward. The support pins 416 are configured to be inserted into pin insertion holes (not shown) provided in the stage 410. When the stage 410 moves down, the water W is supported by upper ends of the support pins 416. Thus, the wafer W can be transferred.

A loading/unloading port 417 for loading and unloading the wafer W is provided in a lower sidewall of the chamber 401. The loading/unloading port 417 is opened and closed by a gate valve 418.

On the other hand, a transmission plate 420 made of a dielectric material is airtightly provided in a ceiling portion of the chamber 401. A plasma generation source 421 for generating plasma of an Ar gas in a processing space P inside the chamber 401 is provided on an upper surface side of the transmission plate 420. The plasma generation source 421 includes an induction coil 422 provided along the upper surface of the transmission plate 420 and a plasma-generating high-frequency power supply 423 connected to the induction coil 422. An inductive electric field is formed in the processing space P via the transmission plate 420 by applying high-frequency electric power of, for example, 13.56 MHz, from the plasma-generating high-frequency power supply 423 to the induction coil 422.

An upper portion of the chamber 401 is formed of an inclined portion 401a. A target having an annular shape (truncated conical shell shape) whose cross section is inclined inwardly is mounted inside the inclined portion 401a. A DC voltage supply configured to supply a DC voltage to the target and a magnet installed on an outer circumference side of the target are provided and configured as a PVD apparatus. However, these are not necessary when performing Ar ion sputtering. Thus, the illustration and description thereof are omitted.

The Ar ion sputtering apparatus 400 includes a control part 430 for controlling the respective constituent parts thereof, for example, the valves of the exhaust mechanism 405 and the gas supply mechanism 407, the bias high-frequency power supply 415, the plasma-generating high-frequency power supply 423, the lifting mechanism and the like.

In such an Ar ion sputtering apparatus 400, an Ar gas is supplied from the gas supply mechanism 407 into the chamber 401, and high-frequency power is applied from the plasma generating high-frequency power supply 423 to the induction coil 422, whereby Ar plasma is generated in the processing space P inside the chamber 401. Bias high-frequency power is applied from the bias high-frequency power supply 415 to the stage 410, whereby Ar ions are drawn into the wafer W to subject the surface of the wafer W to an Ar ion sputtering process.

As for the Ar ion sputtering process performed in the Ar ion sputtering apparatus 400, the conditions of the following ranges may be used.

Pressure: 1 to 10 mTorr (0.13 to 1.3 Pa)
High-frequency power for plasma generation: 0.5 to 3 kW
High-frequency power for bias: 0.4 to 2 kW
Temperature: 10 to 55 degrees C.

[Film Forming System]

In the present embodiment, as long as the Ar ion sputtering apparatus is separately provided without integration, the film forming system 1 of FIG. 7 according to the first embodiment may be applied. In this case, it may be possible to adopt the same configuration as the film forming system 1 of FIG. 7, except that the TiON film forming apparatus 11 is appropriately replaced by an apparatus for forming an arbitrary base film such as a TiN film, a Ta film, a TaN film, a TaAlN film, a TiON film, or the like.

Figure 13:
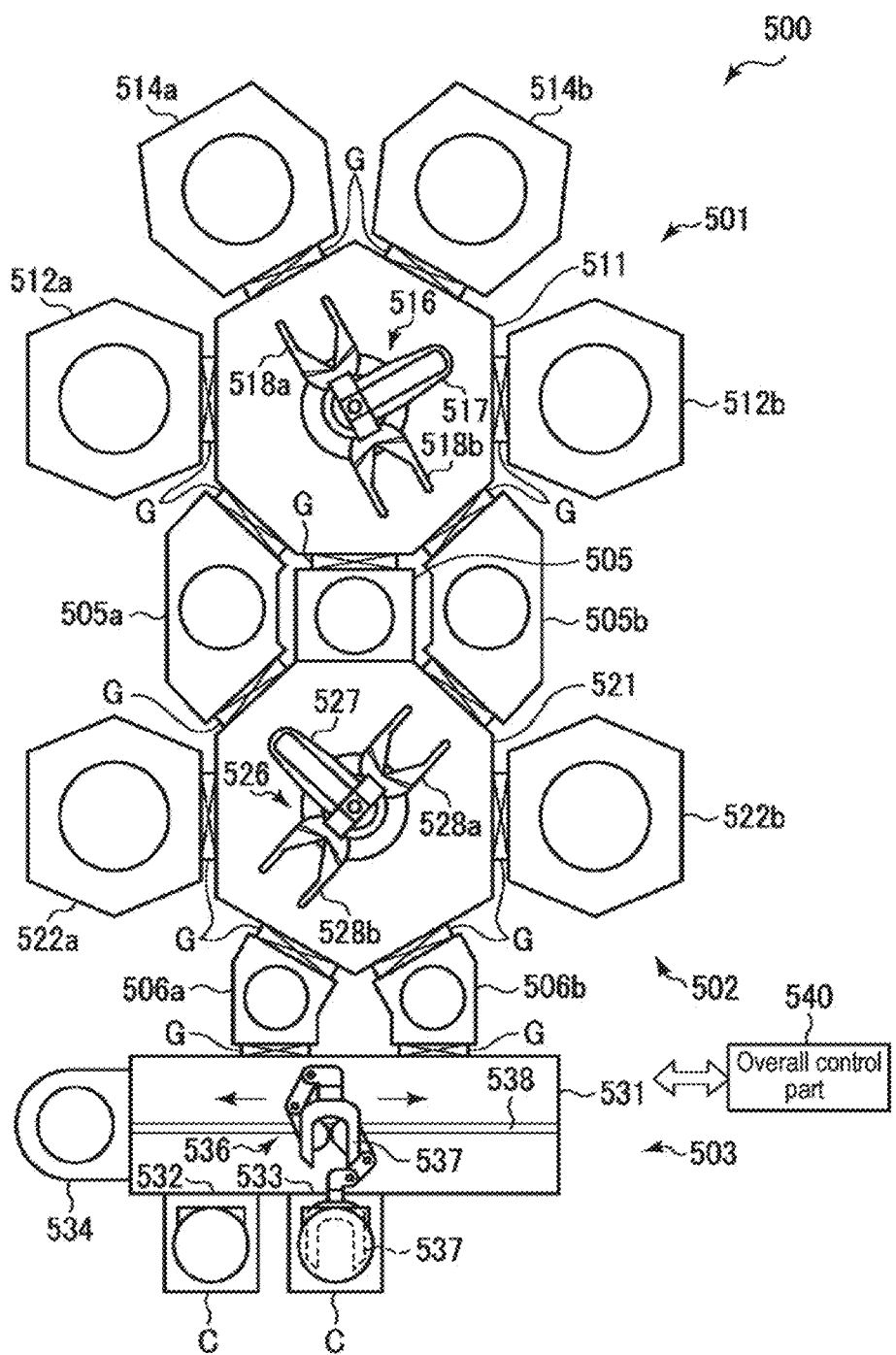
FIG. 13 is a horizontal sectional view schematically showing an example of a film forming system capable of collectively carrying out the method of manufacturing a Ru wiring according to the second embodiment.

On the other hand, in the case of integrating the Ar ion sputtering apparatus, it may be possible to use a film forming system 500 illustrated in FIG. 13.

The film forming system 500 includes a first processing part 501 for forming a base film and a Ru film, a second processing part 502 for Ar ion sputtering, and a loading/unloading part 503.

The first processing part 501 includes a first vacuum transfer chamber 511, two base film forming apparatuses 512a and 512b and two Ru film forming apparatuses 514a and 514b connected to wall portions of the first vacuum transfer chamber 511. The base film forming apparatus 512a and the Ru film forming apparatus 514a are disposed symmetrical along a vertical axis across from the base film forming apparatus 512b and the Ru film forming apparatus 514b, respectively.

Degassing chambers 505a and 505b for performing a degassing process with respect to the wafer W are connected to the other wall portions of the first vacuum transfer chamber 511. A transfer chamber 505 for transferring the wafer W between the first vacuum transfer chamber 511 and a second vacuum transfer chamber 521 to be described later is connected to a wall portion between the wall portions where the degassing chambers 505a and 505b are connected.

The base film forming apparatuses 512a and 512b, the Ru film forming apparatuses 514a and 514b, the degassing chambers 505a and 505b, and the transfer chamber 505 are connected to the respective sides of the first vacuum transfer chamber 511 via gate valves G.

An interior of the first vacuum transfer chamber 511 is kept in a predetermined vacuum atmosphere. A first transfer mechanism 516 for transferring the wafer W is provided in the first vacuum transfer chamber 511. The first transfer mechanism 516 includes a rotation/expansion/contraction part 517 and two wafer transfer arms 518*a* and 518*b* provided at a tip thereof. The first transfer mechanism 516 loads and unloads the wafer W into and from the base film forming apparatuses 512*a* and 512*b*, the Ru film forming apparatuses 514*a* and 514*b*, the degassing chambers 505*a* and 505*b*, and the transfer chamber 505.

The second processing part 502 includes a second vacuum transfer chamber 521 and two Ar ion sputtering apparatuses 522*a* and 522*b* connected to opposite wall portions of the second vacuum transfer chamber 521.

The degassing chambers 505*a* and 505*b* are respectively connected to two wall portions of the second vacuum transfer chamber 521 on the side of the first processing part 501. The transfer chamber 505 is connected to a wall portion between the wall portions where the degassing chambers 505*a* and 505*b* are connected. That is, the transfer chamber 505 and the degassing chambers 505*a* and 505*b* are provided between the first vacuum transfer chamber 511 and the second vacuum transfer chamber 521. Load lock chambers 506*a* and 506*b* capable of performing atmospheric transfer and vacuum transfer are respectively connected to two wall portions of the second vacuum transfer chamber 521 on the side of the loading/unloading part 503.

The Ar ion sputtering apparatuses 522*a* and 522*b*, the degassing chambers 505*a* and 505*b*, and the load lock chambers 506*a* and 506*b* are connected to the respective wall portions of the second vacuum transfer chamber 521 via gate valves G. In addition, the transfer chamber 505 is connected to the second vacuum transfer chamber 521 without a gate valve.

An interior of the second vacuum transfer chamber 521 is kept in a predetermined vacuum atmosphere. A second transfer mechanism 526 for transferring the wafer W is provided in the second vacuum transfer chamber 521. The second transfer mechanism 526 includes a rotation/expansion/contraction part 527 and two wafer transfer arms 528*a* and 528*b* provided at a tip thereof. The second vacuum transfer chamber 521 loads and unloads the wafers W into and from the Ar ion sputtering apparatuses 522*a* and 522*b*, the degassing chambers 505*a* and 505*b*, the load lock chambers 506*a* and 506*b*, and the transfer chamber 505.

The loading/unloading part 503 is provided opposite the second processing part 502 while the load lock chambers 506*a* and 506*b* are interposed therebetween. The loading/unloading part 503 includes an atmospheric transfer chamber 531 to which the load lock chambers 506*a* and 506*b* are connected. Gate valves G are provided on a wall portion of the atmospheric transfer chamber 531 between the load lock chambers 506*a* and 506*b* and the atmospheric transfer chamber 531. Two connection ports 532 and 533 for connecting carriers C accommodating wafers W are provided on a wall portion opposite the wall portion of the atmospheric transfer chamber 531 to which the load lock chambers 506*a* and 506*b* are connected. An alignment chamber 534 for aligning the wafer W is provided on a side surface of the atmospheric transfer chamber 531. Inside the atmospheric transfer chamber 531, there is provided an atmospheric transfer mechanism 536 for loading and unloading the wafer W into and from the carriers C and for loading and unloading the wafer W into and from the load lock chambers 506*a* and 506*b*. The atmospheric transfer mechanism 536 includes two articulated arms and may run on a rail 538 along an arrangement direction of the carriers C. The atmospheric transfer mechanism 536 is configured to transfer the wafer W held on a hand 537 provided at a tip end of each of the articulated arms.

The film forming system 500 includes an overall control part 540. The overall control part 540 includes: a main control part including a CPU (computer) for controlling the respective constituent parts of the base film forming apparatuses 512*a* and 512*b*, the Ru film forming apparatuses 514*a* and 514*b* and the Ar ion sputtering apparatuses 522*a* and 522*b*, the exhaust mechanisms and the transfer mechanisms 516 and 526 of the vacuum transfer chambers 511 and 521, the degassing chambers 505*a* and 505*b*, the exhaust mechanisms and the gas supply mechanisms of the load lock chambers 506*a* and 506*b*, the transfer mechanism 536 of the atmospheric transfer chamber 531, a drive system of the gate valves G, and the like; an input device (a keyboard, a mouse, etc.); an output device (a printer, etc.); a display device (a display, etc.); and a memory device (storage medium). The main control part of the overall control part 540 causes the film forming system 500 to execute predetermined operations based on, for example, a process recipe stored in a storage medium built in the memory device or a storage medium set in the memory device.

The base film forming apparatuses 512*a* and 512*b* are configured to form a base film including a TiN film, a Ta film, a TaN film, a TaAlN film, a TiON film, or the like. As the base film forming apparatuses 512*a* and 512*b*, it may be possible to use an ALD apparatus similar to the TiON film forming apparatus 11 of the first embodiment, a CVD apparatus having the same configuration as the ALD apparatus, or an iPVD apparatus. As the iPVD apparatus, it may be possible to use an apparatus having a configuration in which a target made of a material to be deposited is attached to the Ar ion sputtering apparatus 400. As the Ru film forming apparatuses 514*a* and 514*b*, it may be possible to use the same apparatus as the Ru film forming apparatus 13 of the first embodiment shown in FIG. 9. In addition, as the Ar ion sputtering apparatuses 522*a* and 522*b*, it may be possible to use the same apparatus as the Ar ion sputtering apparatus 400 shown in FIG. 12.

Next, the operation of the film forming system 500 configured as above will be described. The following processing operation is executed based on the process recipe stored in the storage medium of the overall control part 540.

First, the wafer W is taken out from the carrier C by the atmospheric transfer mechanism 536 and is transferred to the load lock chamber 506*a* or 506*b*. The load lock chambers depressurized to a same degree of vacuum as that of the second vacuum transfer chamber 521, and then the wafer W in the load lock chamber is transferred to the degassing chamber 505*a* or 505*b* by the second transfer mechanism 526. The wafer W is subjected to a degassing process. Thereafter, the wafer W in the degassing chamber is taken out by the first transfer mechanism 516 and is loaded into the base film forming apparatus 512*a* or 512*b* to form a base film including a TiN film, a Ta film, a TaN film, a TaAlN film, a TiON film, or the like. The base film is formed by ALD, CVD, or iPVD. After forming the base film, the wafer W is transferred to the Ru film forming apparatus 514*a* or 514*b* by the first transfer mechanism 516. A Ru film is formed by CVD to fill the trench and the holes formed in the wafer W.

After the Ru film is formed, the wafer W is transferred from the Ru film forming apparatus 514*a* or 514*b* to the transfer chamber 505 by the first transfer mechanism 516. Thereafter, the wafer W is taken out by the second transfer mechanism 526 and is loaded into the Ar ion sputtering apparatus 522a or 522b. Then, the wafer W is subjected to a planarization process by the Ar ion sputtering, apparatus 522a or 522b. Prior to the planarization process, the wafer W may be transferred to an appropriate apparatus capable of heating the wafer W, such as the degassing chamber 505a or 505b or the like and may be subjected to an annealing process.

After the planarization process, the wafer W is transferred to the load lock chamber 506a or 506b by the second transfer mechanism 526. After the load lock chamber is returned to atmospheric pressure, the wafer W is taken out by the atmospheric transfer mechanism 536 and is returned to the carrier C. This process is repeated by the number of wafers W in the carrier.

According to such a film forming system 500, it is possible to successively perform the formation of the base film, the formation of the Ru film and the planarization process in a vacuum without being exposed to the atmosphere. Therefore, it is possible to obtain a Ru wiring at a high speed while preventing oxidation.

Experimental Example

Figure 14:
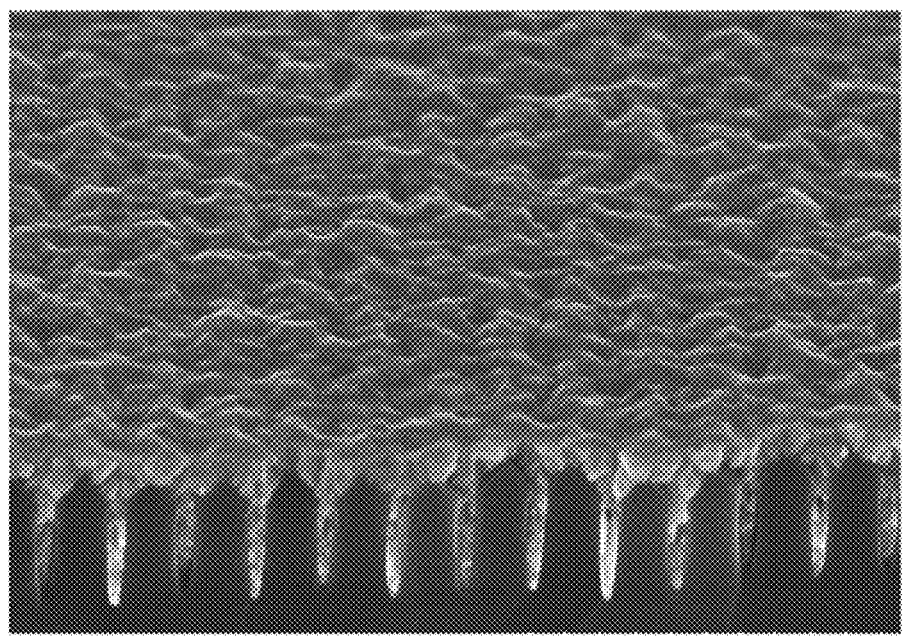
FIG. 14 is a SEM photograph showing a state in which a base film made of a TaN film is formed on a wafer having a trench formed in an interlayer insulating film and then a Ru film is formed to embed the trench.

Next, an experimental example of the second embodiment will be described. In this experimental example, a base film made of a TaN film was formed at a thickness of about 0.5 nm by iPVD on a wafer in which a trench having a width of about 20 nm is formed in an interlayer insulating film on a Si substrate. Then, a Ru film was formed at a thickness of 20 nm by CVD to fill the trench. An SEM photograph available at that time is shown in FIG. 14. From this SEM photograph, it is noted that the Ru film is formed on the wafer surface and is embedded in the trench.

Figure 15:
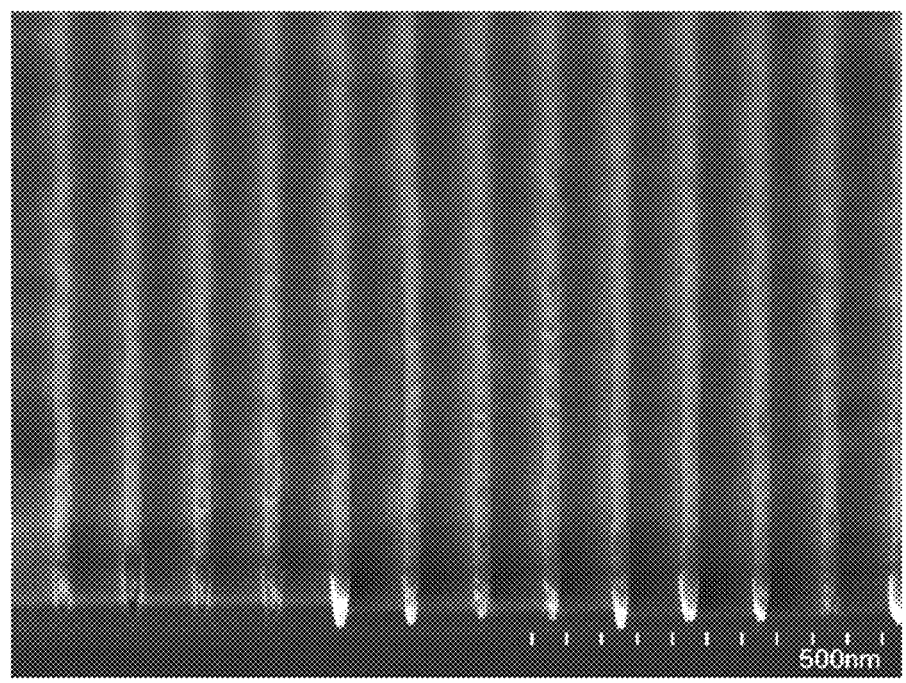
FIG. 15 is an SEM photograph showing a state in which the wafer in the state shown in FIG. 14 is subjected to Ar ion sputtering to remove the Ru film and the TaN film on the wafer surface.

Thereafter, Ar ion sputtering was performed to remove the Ru film and the TaN film on the water surface. The conditions used at this time include a pressure of 2.5 mTorr (0.33 Pa), high-frequency power for plasma generation of 1 kW, high-frequency power for bias of 1 kW, and a temperature of 10 degrees C. An SEM photograph available at that time is shown in FIG. 15. From this SEM photograph, it is noted that the Ru film and the TaN film on the wafer surface are removed and the Ru film is embedded only in the trench. As a result, it was confirmed that a planarization process can be performed by Ar ion sputtering.

Next, a TaN film having a thickness of 0.5 nm was formed as a base film on the trenches of various widths by iPVD. Then, a Ru film having a thickness of 20 nm was formed to fill the trenches. Thereafter, planarization was performed by Ar ion sputtering to form a Ru wiring, and electrical characteristics thereof were investigated.

Figure 16:
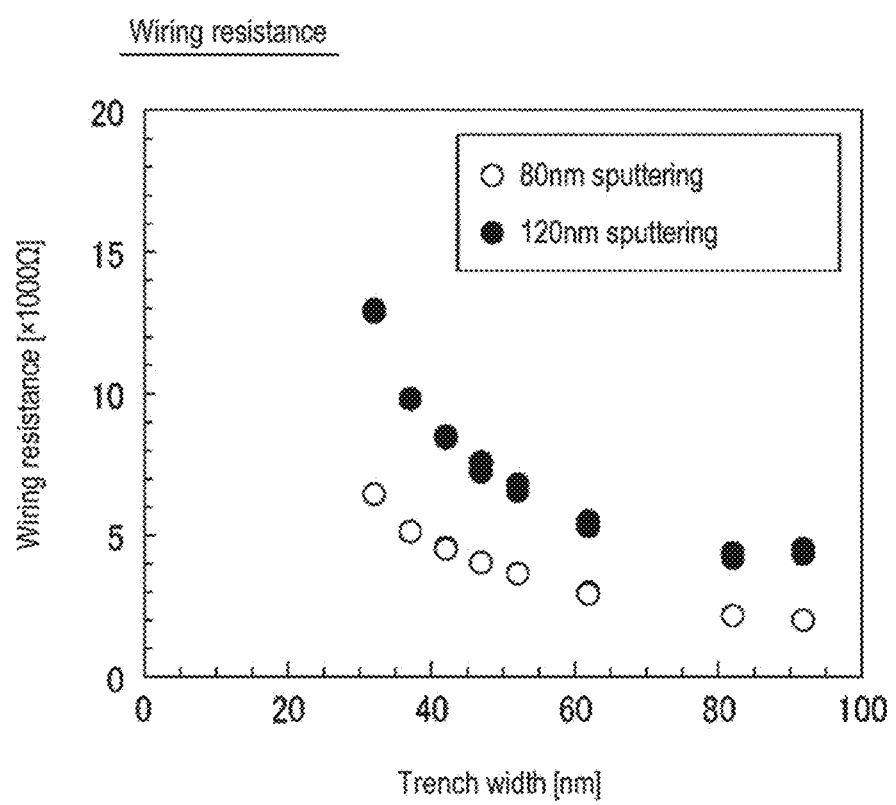
FIG. 16 is a view showing the relationship between a trench width and a wiring resistance when a TaN film as a base film is formed on trenches of different widths, a Ru film is formed to embed the trenches and then planarization is performed by Ar ion sputtering to form a Ru wiring.

First, the result of measuring a wiring resistance will be described. In this case, the wiring resistance was measured when the Ru film sputtering amount in the Ar ion sputtering is set to 80 nm and 120 nm in terms of a Ta film. FIG. 16 is a view showing the relationship between the trench width and the wiring resistance. As shown in FIG. 16, when the sputtering amount is 120 nm rather than 80 nm, the wiring resistance becomes higher. As the trench width is smaller, the wiring resistance tends to become higher. Therefore, it was confirmed that a sound Ru wiring is formed.

Figure 17:
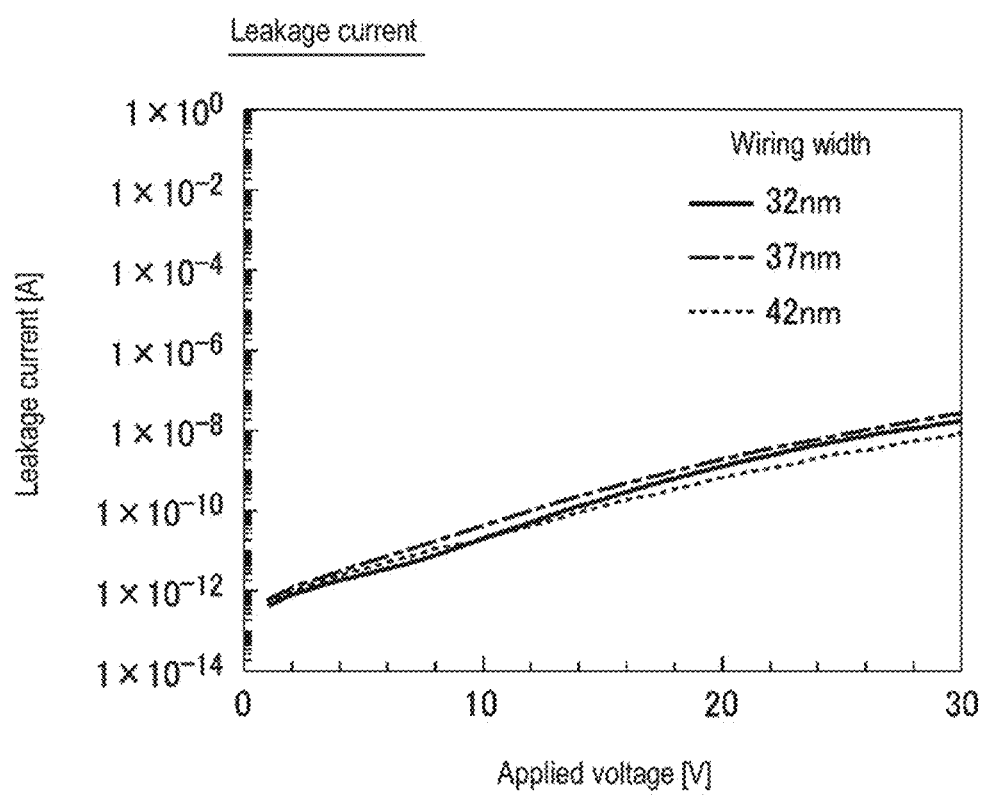
FIG. 17 is a view showing the relationship between an applied voltage and a leakage current when a TaN film as a base film is formed on trenches of different widths, a Ru film is formed to embed the trenches and then planarization is performed by Ar ion sputtering to form a Ru wiring.

Next, the result of measuring a leakage current will be described. In this case, the leakage current was measured in the cases where the wiring widths are 32 nm, 37 nm, and 42 nm. FIG. 17 is a view showing the relationship between the applied voltage and the leakage current. As shown in FIG. 17, the leakage current increases as the applied voltage rises. However, even if 30 V is applied, the leakage current is $1 \times 10^{-8}$ A or less. Therefore, it was confirmed that the wirings are well insulated.

Other Applications

While the embodiments of the present disclosure have been described above, the present disclosure is not limited to the above-described embodiments. Various modifications may be made within the scope of the technical idea of the present disclosure. For example, the film forming system, the TiON film forming apparatus, the Ru film forming apparatus, and the Ar ion sputtering apparatus as the Ar plasma processing apparatus described in the above embodiments are nothing more than examples and are not limited to those of the above-described embodiments. In particular, although the ICP plasma sputtering apparatus is exemplified as the Ar plasma processing apparatus, the present disclosure is not limited thereto. The Ar plasma processing may be performed using other plasma sources such as a parallel plate type plasma source or the like.

Further, in the above-described embodiments, description has been made where the Ru wiring is manufactured by forming the base film on the interlayer insulating film in which the trench and the via holes are formed and then embedding the Ru film. However, the present disclosure is not limited thereto. The present disclosure may be applied to a case where a Ru wiring is manufactured by forming a base film on a substrate having a recess and then embedding a Ru film.

In addition, although the semiconductor water has been exemplified as a substrate to be processed, the substrate is not limited thereto in terms of the principle of the present disclosure. The substrate may be another substrate such as, for example, a substrate for FPD represented by a substrate for a liquid crystal display device.

According to the present disclosure in some embodiments, a TiON film having a smaller tensile stress acting thereon than a TiN film is used as a base film of a ruthenium film. It is therefore possible to reduce stress acting on a film laminated with the ruthenium film and to reduce deformation of a wiring structure caused by stress. In addition, by adjusting the amount of oxygen in a film, it is possible to control the stress in the film and to effectively suppress deformation of a wiring structure caused by stress.

According to the present disclosure in some embodiments, argon plasma is used for a planarization process performed after forming a ruthenium film and embedding a recess. It is therefore possible to easily carry out planarization.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A method of manufacturing a ruthenium wiring by filling a recess formed in a predetermined film, a substrate having the predetermined film in a surface of the substrate, comprising:

forming a TiON film as a base film on at least a surface of the recess,
   wherein forming the TiON film is performed by disposing the substrate in a processing container, keeping an interior of the processing container in a depressurized state at a predetermined processing temperature, and repeating one cycle, Y times, so as to obtain a desired film thickness, the one cycle including:
      forming a TiN film by alternately repeating, X times, supplying a Ti-containing gas into the processing container and supplying a nitriding gas into the processing container; and
      oxidizing the TiN film by supplying an oxidizing agent into the processing container,
   wherein Y is an integer greater than 1, and X is an integer greater than 1, and
   wherein the number of X times is adjusted to control an atomic percent of an oxygen with respect to the TiON film to become 50 atomic percent or more and less than 100 atomic percent, and the number of Y times is adjusted to control the desired film thickness to be in a range of 1 to 10 nm;
forming a ruthenium film on the TiON film having the atomic percent of the oxygen of 50 atomic percent and less than 100 atomic percent, and the film thickness in a range of 1 to 10 nm, so as to fill the recess; and
after the ruthenium film is formed to fill the recess, planarizing the surface of the substrate by removing the ruthenium film and the TiON film which are formed on the surface of the substrate,
wherein the planarizing is performed by removing the ruthenium film and the TiON film formed on the surface of the substrate through a process including an argon plasma process.

2. The method of claim 1, wherein the predetermined film is an interlayer insulating film, and a trench and a via hole are formed as the recess in the interlayer insulating film.

3. The method of claim 1, wherein the planarizing is further performed by polishing the ruthenium film and the TiON film formed on the surface of the substrate through CMP.

4. The method of claim 1, wherein the planarizing is performed by removing the ruthenium film and the TiON film on the surface of the substrate through the argon plasma process and then polishing the ruthenium film and the TiON film on the surface of the substrate through CMP.

5. The method of claim 1, wherein the argon plasma process is an argon ion sputtering process.

6. The method of claim 1, further comprising:
performing an annealing process after forming the ruthenium film and before planarizing.

7. The method of claim 1, wherein a stress acting on the TiON film is controlled by adjusting the atomic percent of the oxygen with respect to the TiON film.

8. The method of claim 1, wherein the Ti-containing gas used when forming the TiON film is a $TiCl_4$ gas, and the nitriding gas used when forming the TiON film is an $NH_3$ gas.

9. The method of claim 1, wherein an oxygen-containing gas selected from a group consisting of an $O_2$ gas, an $O_3$ gas, $H_2O$ and $NO_2$, or a plasma obtained by turning the oxygen-containing gas into plasma, is used as the oxidizing agent when forming the TiON film.

10. The method of claim 1, wherein the processing temperature when forming the TiON film is in a range of 300 to 500 degrees C.

11. The method of claim 1, wherein the ruthenium film is formed by CVD.

12. The method of claim 11, wherein when forming the ruthenium film by CVD, ruthenium carbonyl is used as a film forming source.

13. The method of claim 12, wherein a processing temperature when forming the ruthenium film is in a range of 130 to 250 degrees C.

* * * * *